(12) United States Patent
Lin et al.

(10) Patent No.: US 11,908,920 B2
(45) Date of Patent: *Feb. 20, 2024

(54) FIN FIELD-EFFECT TRANSISTOR DEVICE AND METHOD OF FORMING THE SAME

(71) Applicant: Taiwan Semiconductor Manufacturing Co., Ltd., Hsinchu (TW)

(72) Inventors: Shih-Yao Lin, New Taipei (TW);
Kuei-Yu Kao, Hsinchu (TW);
Chih-Han Lin, Hsinchu (TW);
Ming-Ching Chang, Hsinchu (TW);
Chao-Cheng Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/722,787

(22) Filed: Apr. 18, 2022

(65) Prior Publication Data

US 2022/0238696 A1    Jul. 28, 2022

Related U.S. Application Data

(62) Division of application No. 16/822,609, filed on Mar. 18, 2020, now Pat. No. 11,309,403.

(Continued)

(51) Int. Cl.
*H01L 29/66* (2006.01)
*H01L 21/8234* (2006.01)
(Continued)

(52) U.S. Cl.
CPC .. *H01L 29/66545* (2013.01); *H01L 21/30621* (2013.01); *H01L 21/823431* (2013.01);
(Continued)

(58) Field of Classification Search
CPC ......... H01L 29/66545; H01L 29/66795; H01L 29/7856; H01L 29/785; H01L 21/30621; H01L 21/823431
See application file for complete search history.

(56) References Cited

U.S. PATENT DOCUMENTS 8,487,378 B2    7/2013  Goto et al.
8,729,634 B2    5/2014  Shen et al.
(Continued)

FOREIGN PATENT DOCUMENTS

DE    102017118193 A1    4/2018
JP    2013197498 A    9/2013
(Continued)

*Primary Examiner* — Christine A Enad
(74) *Attorney, Agent, or Firm* — Slater Matsil, LLP

(57) ABSTRACT

A method of forming a semiconductor device includes: forming a fin protruding above a substrate; forming isolation regions on opposing sides of the fin; forming a dummy gate electrode over the fin; removing lower portions of the dummy gate electrode proximate to the isolation regions, where after removing the lower portions, there is a gap between the isolation regions and a lower surface of the dummy gate electrode facing the isolation regions; filling the gap with a gate fill material; after filling the gap, forming gate spacers along sidewalls of the dummy gate electrode and along sidewalls of the gate fill material; and replacing the dummy gate electrode and the gate fill material with a metal gate.

20 Claims, 33 Drawing Sheets

Related U.S. Application Data

(60) Provisional application No. 62/928,812, filed on Oct. 31, 2019.

(51) Int. Cl.
*H01L 29/78* (2006.01)
*H01L 21/306* (2006.01)

(52) U.S. Cl.
CPC .... *H01L 29/66795* (2013.01); *H01L 29/7856* (2013.01); *H01L 2029/7858* (2013.01)

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 9,620,417 B2 | 4/2017 | Chen et al. |
| 10,262,870 B2 | 4/2019 | Chen et al. |
| 10,811,536 B2 | 10/2020 | Chen et al. |
| 10,854,519 B2 | 12/2020 | Chen et al. |
| 2002/0142523 A1 | 10/2002 | Ryu et al. |
| 2014/0001559 A1 | 1/2014 | Lin et al. |
| 2014/0282326 A1 | 9/2014 | Chen et al. |
| 2014/0349473 A1 | 11/2014 | Lin et al. |
| 2015/0115363 A1* | 4/2015 | Chang ................ H01L 27/0886 257/347 |
| 2016/0071980 A1 | 3/2016 | Chang et al. |
| 2016/0172496 A1 | 6/2016 | Chang et al. |
| 2017/0005005 A1 | 1/2017 | Chen et al. |
| 2017/0117192 A1 | 4/2017 | Min et al. |
| 2017/0278964 A1 | 9/2017 | Mohapatra et al. |
| 2017/0330955 A1 | 11/2017 | Rahhal-Orabi et al. |
| 2018/0254338 A1* | 9/2018 | Kim ................ H01L 29/66795 |
| 2018/0277571 A1 | 9/2018 | Chang et al. |
| 2019/0006507 A1 | 1/2019 | Ma et al. |
| 2020/0006148 A1 | 1/2020 | Chen et al. |
| 2020/0328207 A1* | 10/2020 | Hong ............. H01L 21/823481 |

FOREIGN PATENT DOCUMENTS

| | | |
|---|---|---|
| JP | 2017532762 A | 11/2017 |
| KR | 20070069957 A | 7/2007 |
| KR | 20190003295 A | 1/2019 |

* cited by examiner

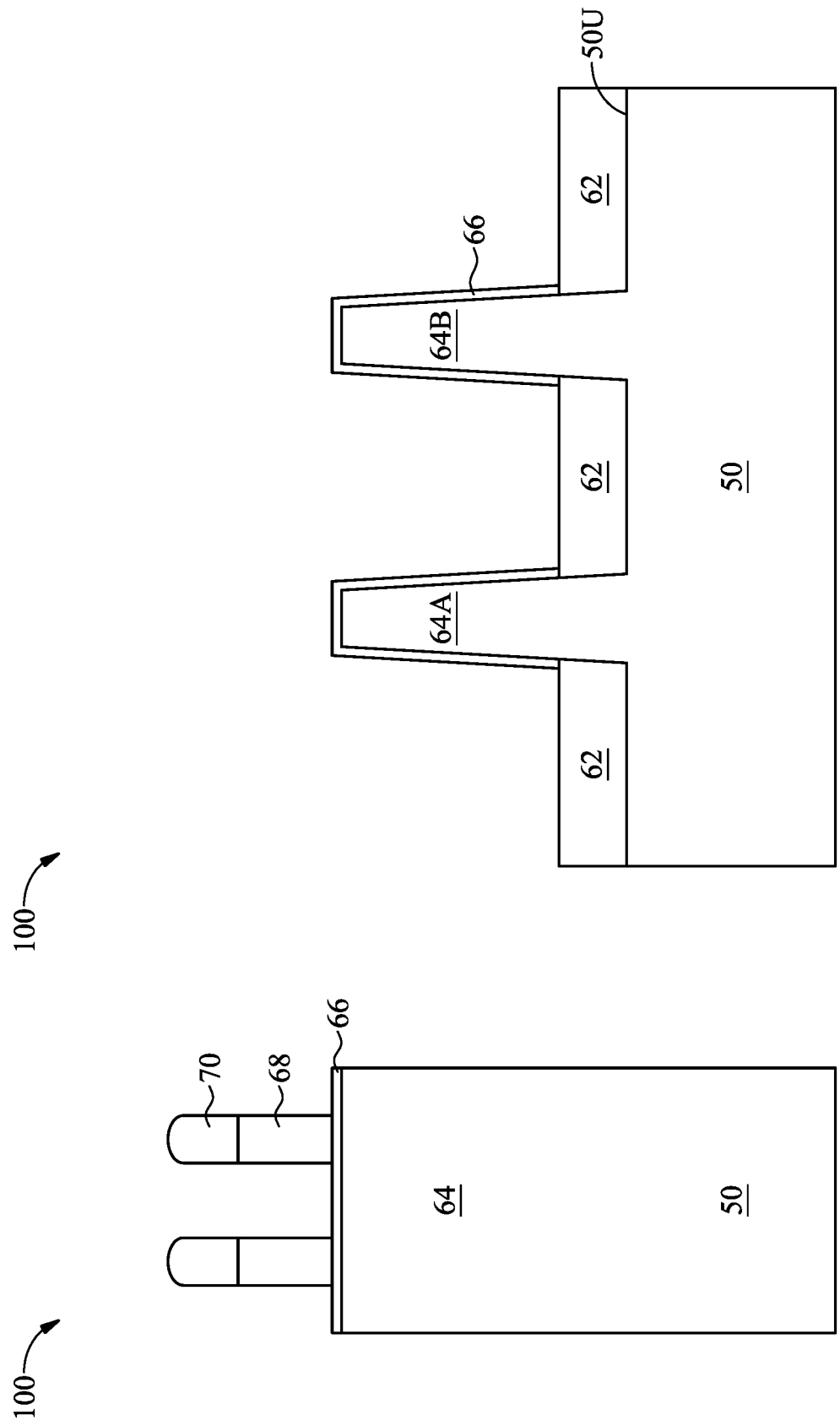

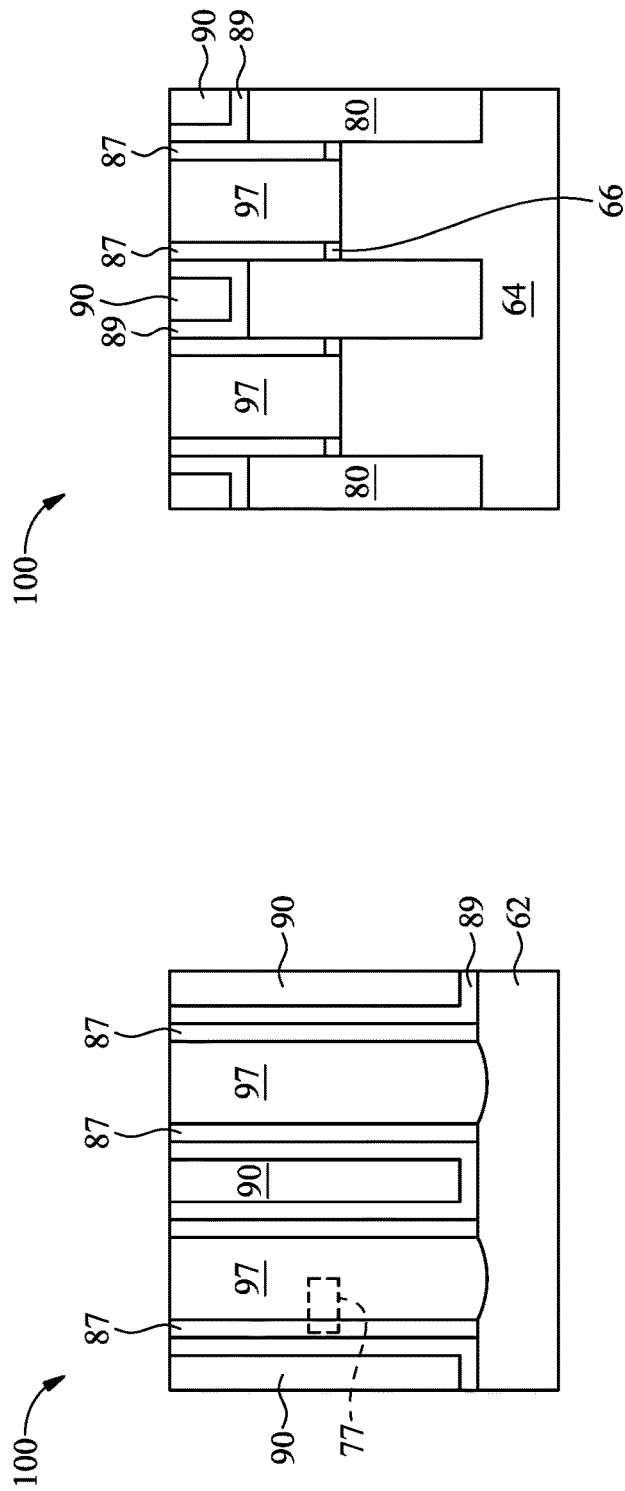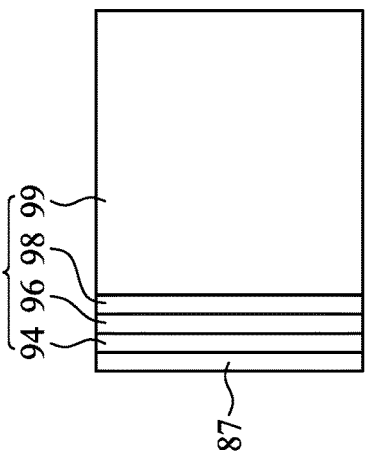
Figure 15B
Figure 15C
Figure 15A

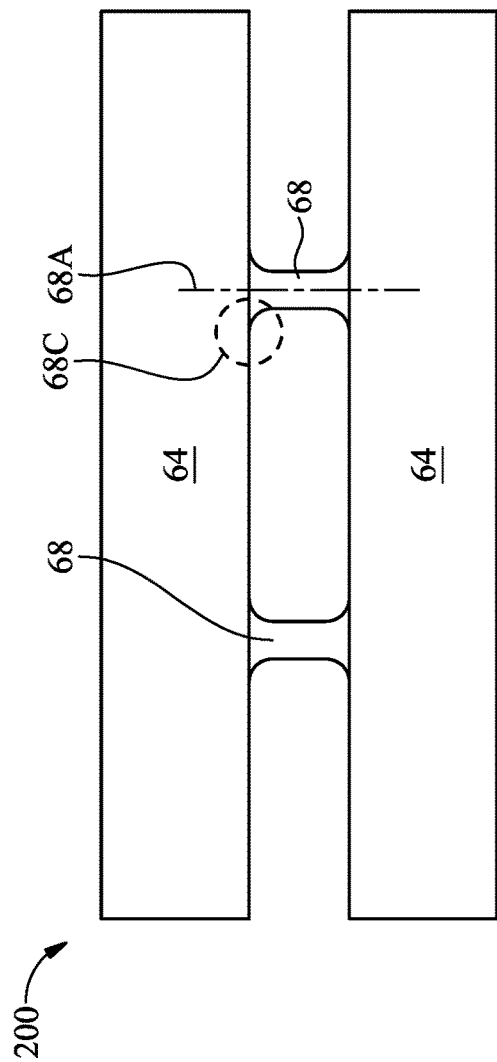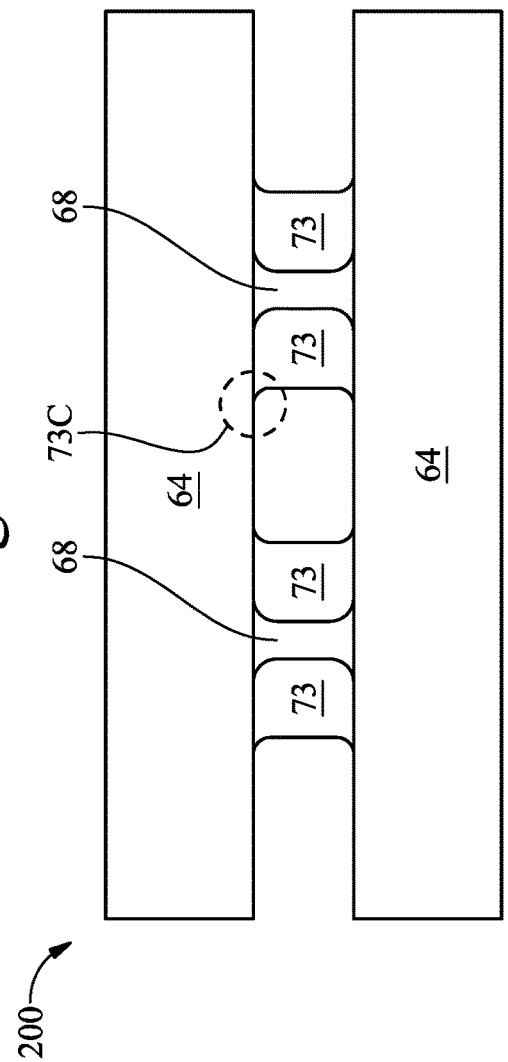

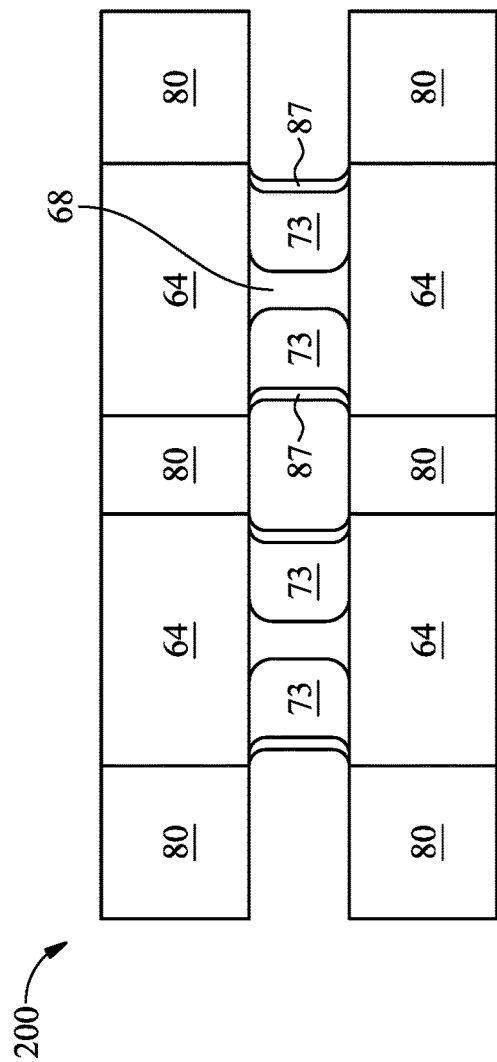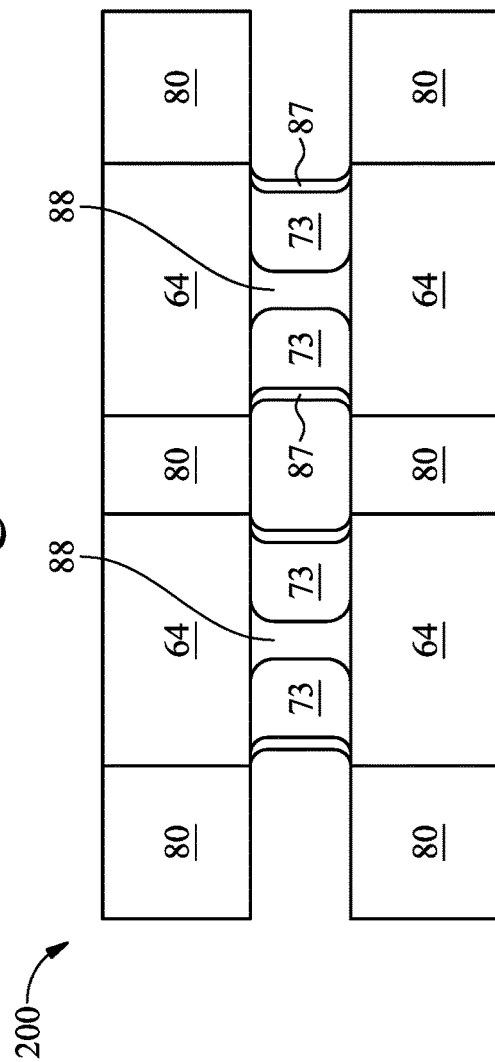

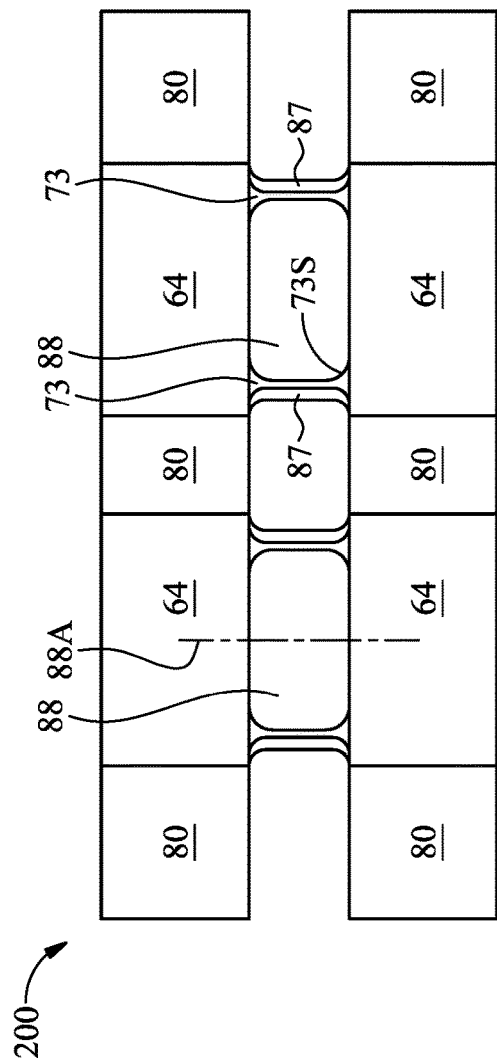
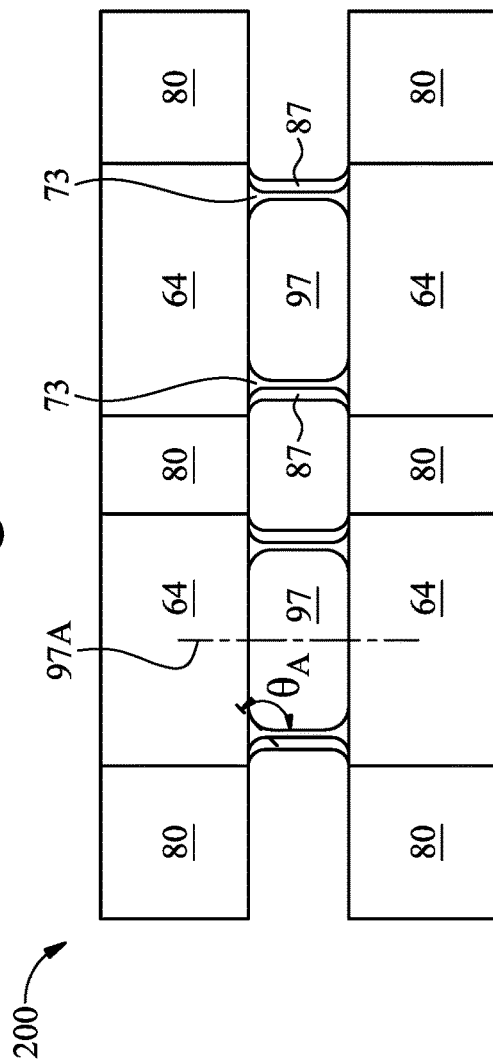
Figure 29
Figure 30

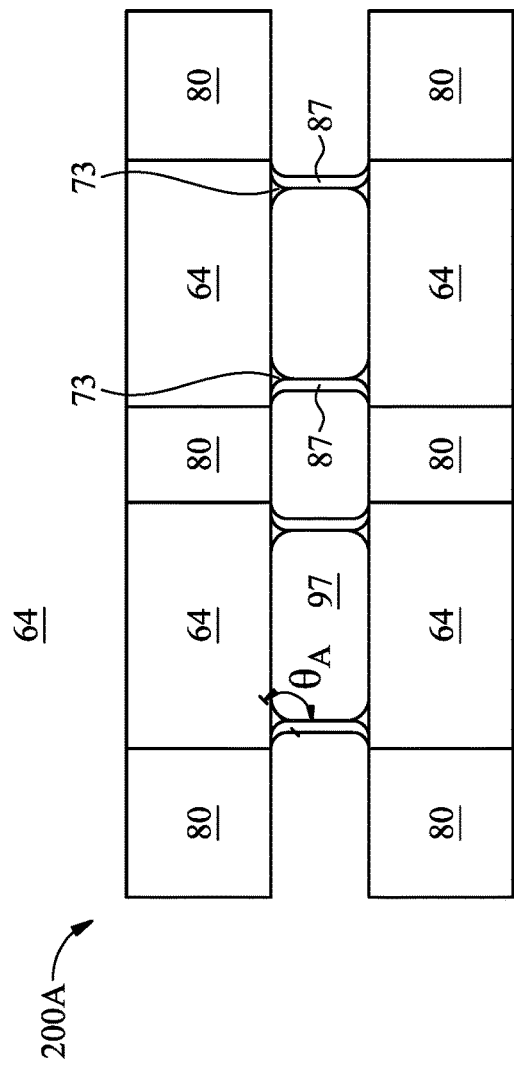
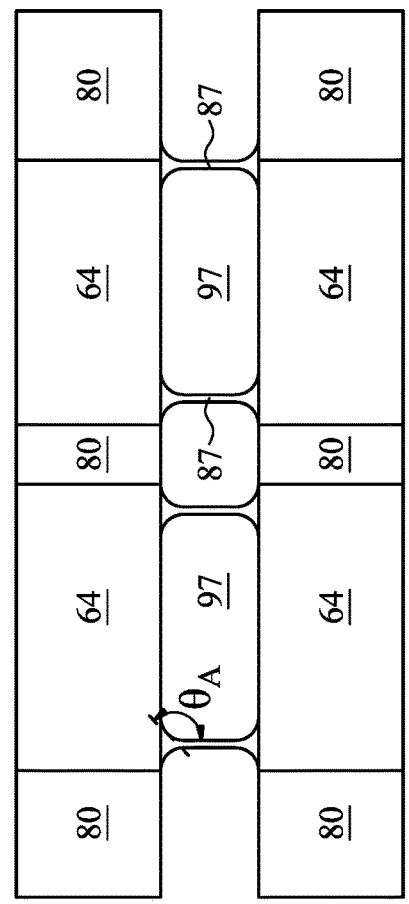
Figure 31
Figure 32

FIN FIELD-EFFECT TRANSISTOR DEVICE AND METHOD OF FORMING THE SAME

PRIORITY CLAIM AND CROSS-REFERENCE

This application is a divisional of U.S. patent application Ser. No. 16/822,609, filed Mar. 18, 2020 and entitled "Fin Field-Effect Transistor Device and Method of Forming the Same," which claims priority to U.S. Provisional Patent Application No. 62/928,812, filed Oct. 31, 2019 and entitled "Fin Field-Effect Transistor Device and Method of Forming the Same," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-4, 5A, 5B, 6, 7A-7F, 8A, 8B, 9A, 9B, 10A, 10B, 11A, 11B, 12A, 12B, 13A, 13B, 14A, 14B, 15A, 15B, and 15C illustrate various views of a FinFET device 100 at various stages of fabrication, in accordance with an embodiment.

FIGS. 25-30 illustrate cross-sectional views of a portion of a FinFET device 200 at various stages of fabrication, in an embodiment.

FIG. 31 illustrate a cross-sectional view of a portion of a FinFET device 200A, in an embodiment.

FIG. 32 illustrate a cross-sectional view of a portion of a FinFET device 200B, in an embodiment.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a FinFET device, and in particular, in the context of forming a replacement gate (e.g., a metal gate) for a FinFET device.

In some embodiments, a dummy gate electrode is formed over a fin that is disposed between isolation regions. A lower portion of the dummy gate electrode is then removed to form a gap between the dummy gate electrode and isolation regions. Next, a gate fill material is formed to fill the gap, and a spacer is formed along sidewalls of the dummy gate electrode and along sidewalls of the gate fill material. After the gate spacers are formed, the dummy gate electrode and at least portions of the gate fill material are removed to form an opening between the gate spacers, and a metal gate structure is formed in the opening.

Figure 1:
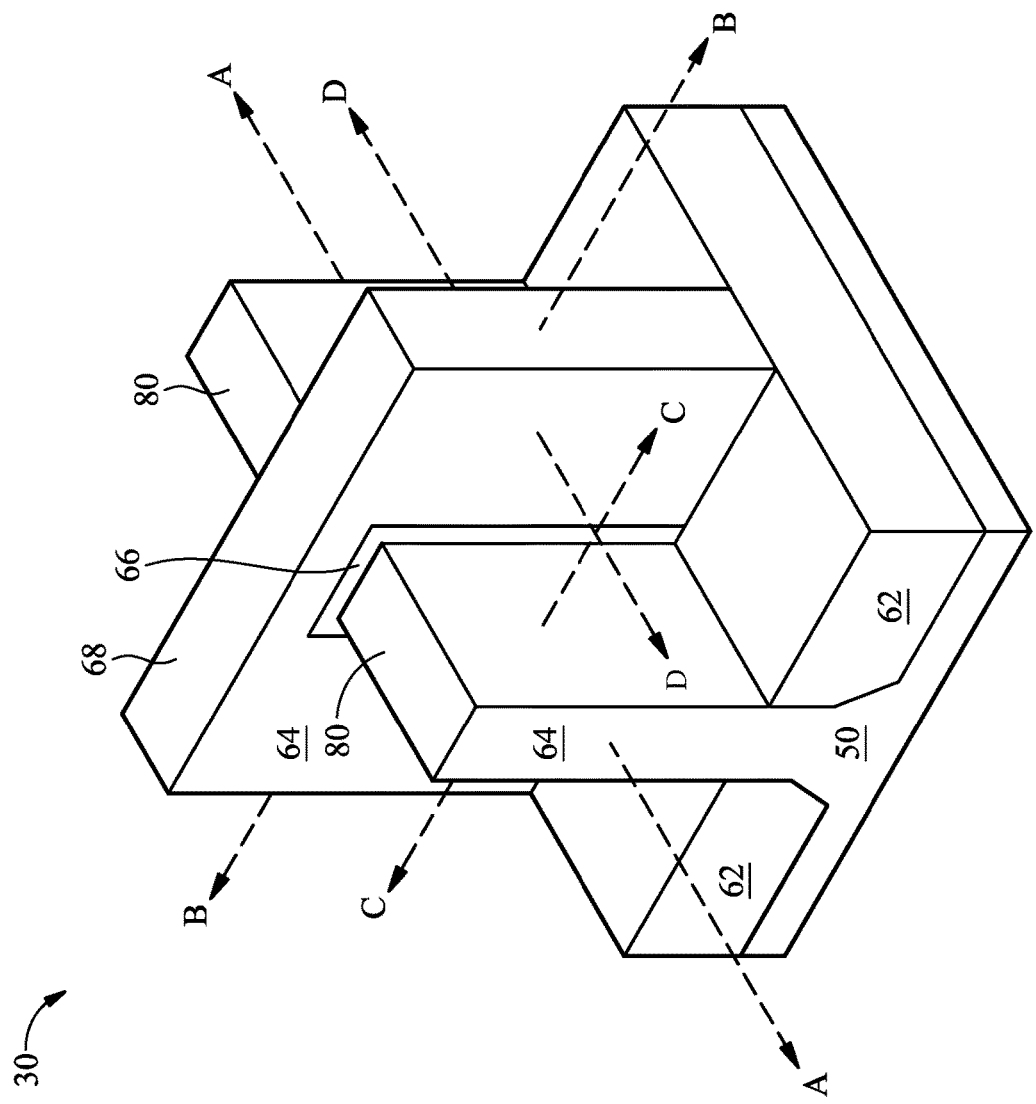
FIG. 1 illustrates a perspective view of a Fin Field-Effect Transistor (FinFET) device, in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Cross-section D-D is parallel to cross-section A-A and is outside of the fin 64 (e.g., between two adjacent fins). Subsequent figures refer to these reference cross-sections for clarity.

Figure 5B:
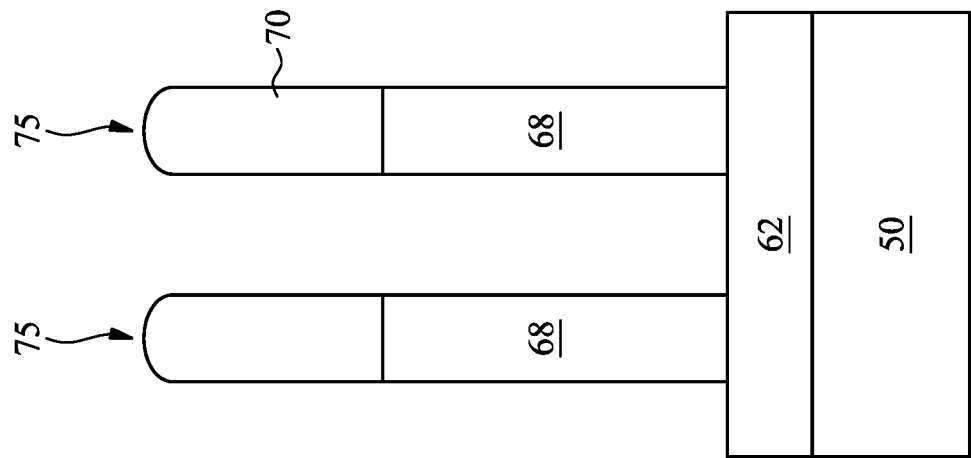
Figure 7A:
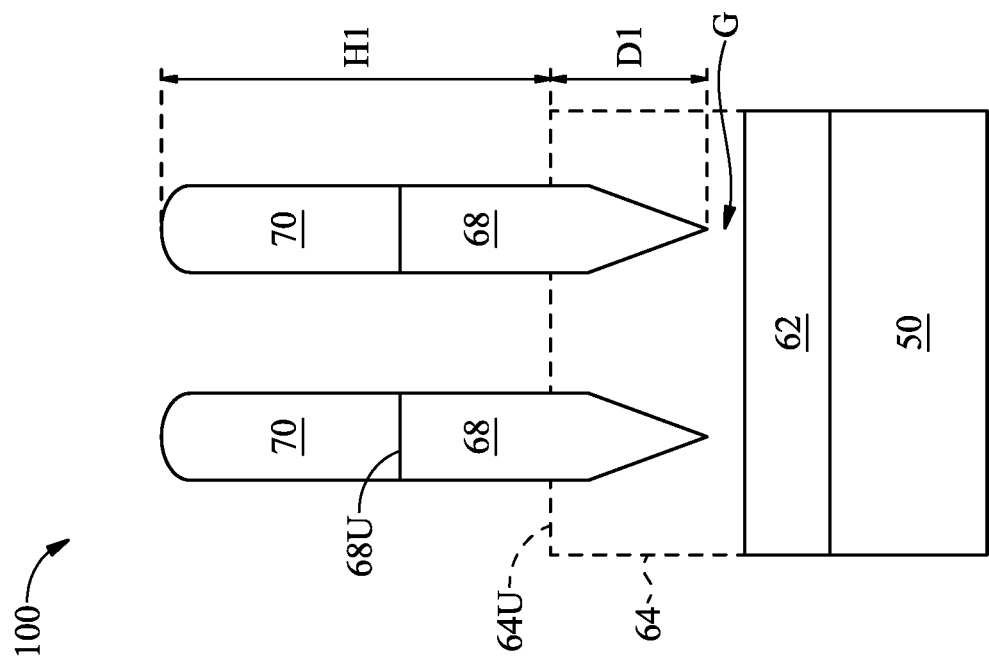
Figure 6:
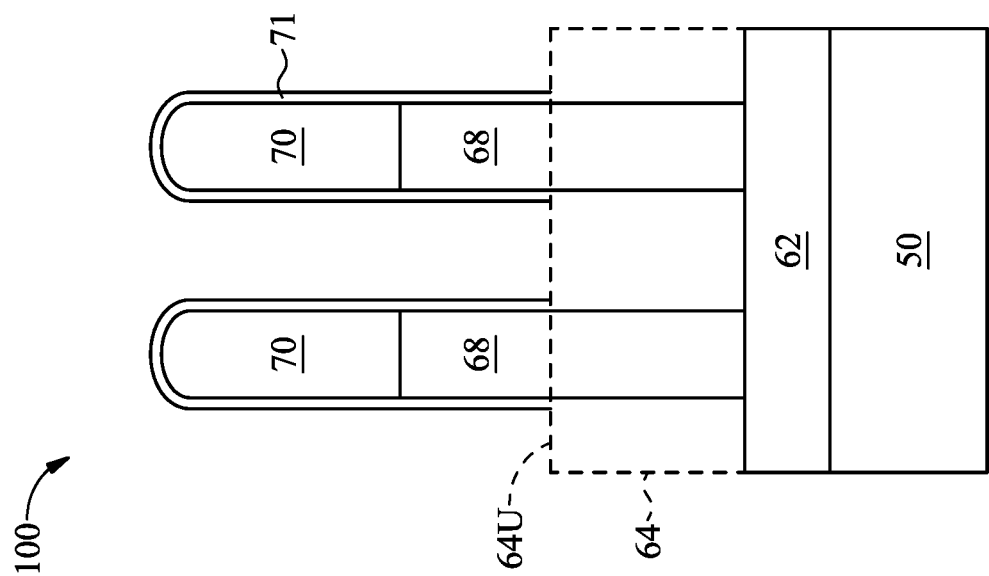
Figure 7B:
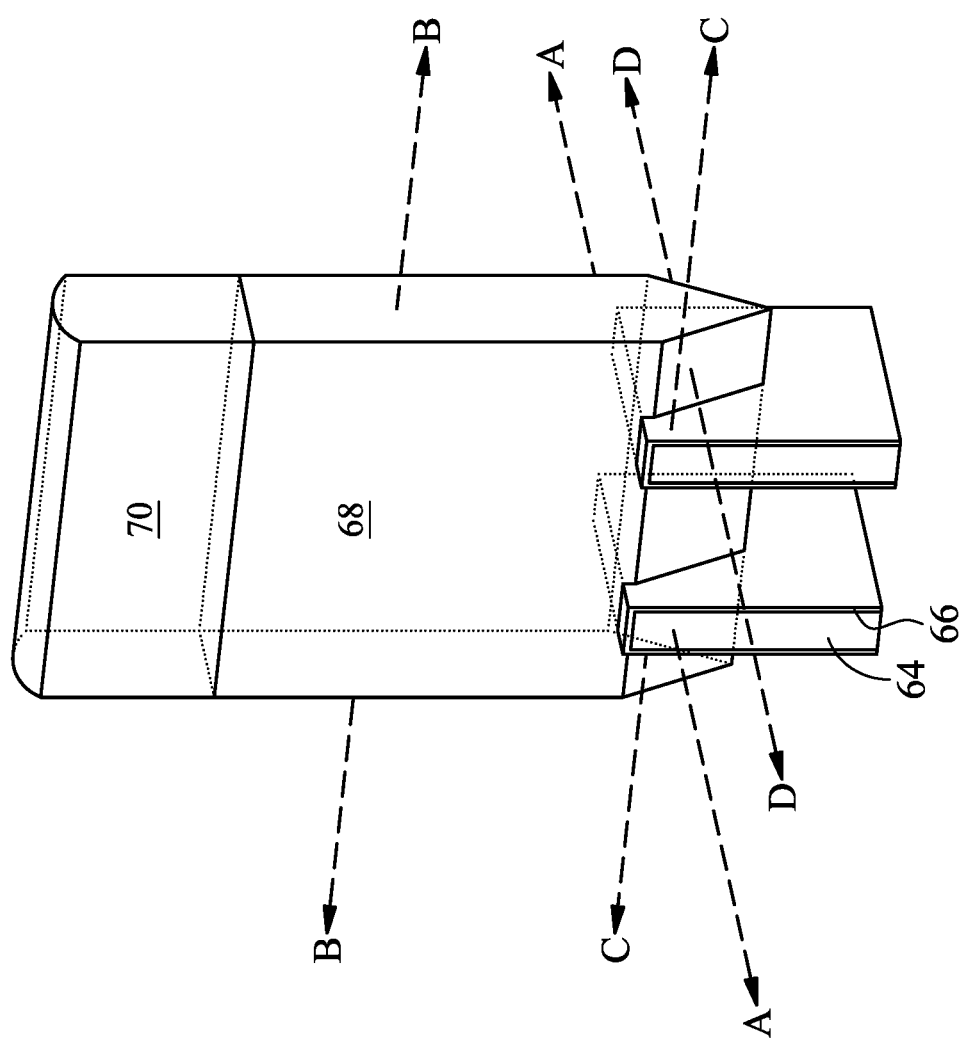
Figure 7C:
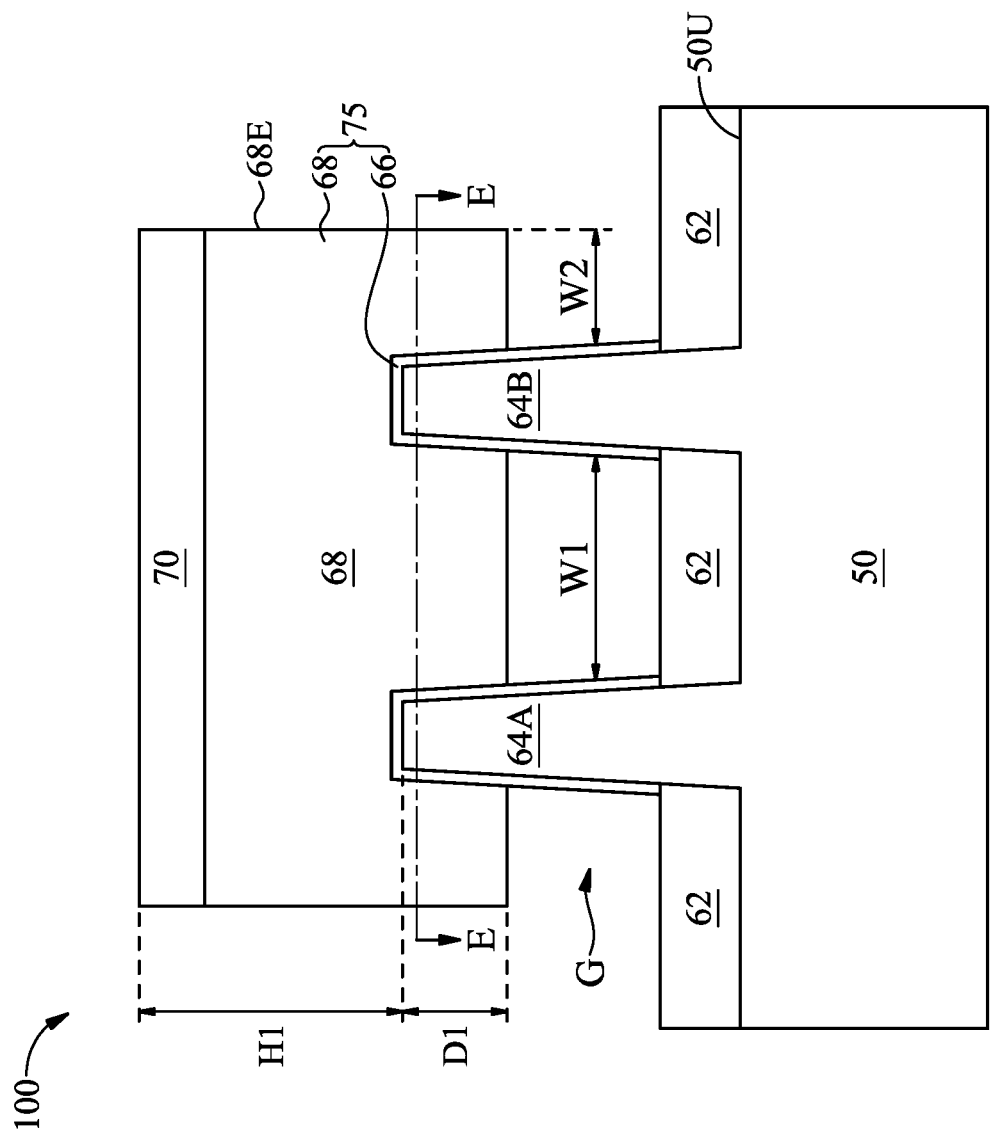
Figure 7F:
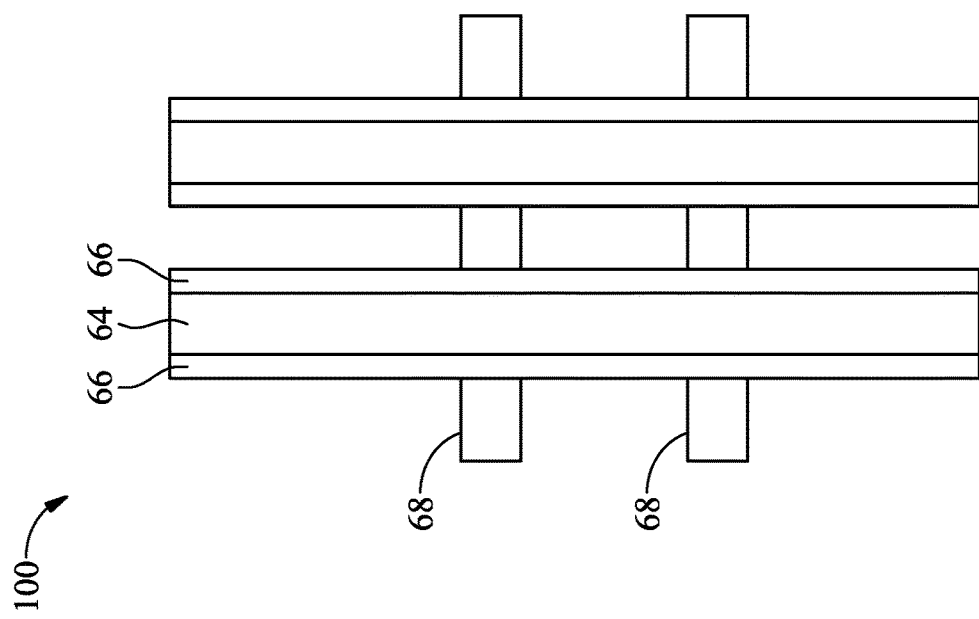

FIGS. 2-4, 5A, 5B, 6, 7A-7F, 8A, 8B, 9A, 9B, 10A, 10B, 11A, 11B, 12A, 12B, 13A, 13B, 14A, 14B, 15A, 15B, and 15C illustrate various views (e.g., cross-sectional view, perspective view, or top view) of a FinFET device 100 at various stages of fabrication, in accordance with an embodiment. The FinFET device 100 is similar to the FinFET 30 in FIG. 1, but with multiple fins and multiple gate structures. Throughout the discussion herein, figures with the same numeral but different letters (e.g., FIG. 5A and FIG. 5B) refer to different views of the FinFET device at a same processing stage. FIGS. 2-4 and 5A illustrate cross-sectional views of the FinFET device 100 along cross-section B-B. FIGS. 5B, 6, and 7A illustrate cross-sectional views of the FinFET device 100 along cross-section D-D. FIGS. 7B and 7C illustrate a perspective view and a cross-sectional view along cross-section B-B, respectively. FIGS. 7D, 7E, and 7F illustrate a cross-sectional view along cross-section A-A, a cross-sectional view along cross-section C-C, and a top view of the FinFET device 100, respectively. FIGS. 8A, 9A, 10A, 11A, 12A, 13A, 14A, and 15A illustrate cross-sectional views of the FinFET device 100 along cross-section D-D, and FIGS. 8B, 9B, 10B, 11B, 12B, 13B, 14B, and 15B illustrate cross-sectional views of the FinFET device 100 along cross-section A-A. FIG. 15C is a zoomed-in view of a portion of FIG. 15A.

Figure 2:
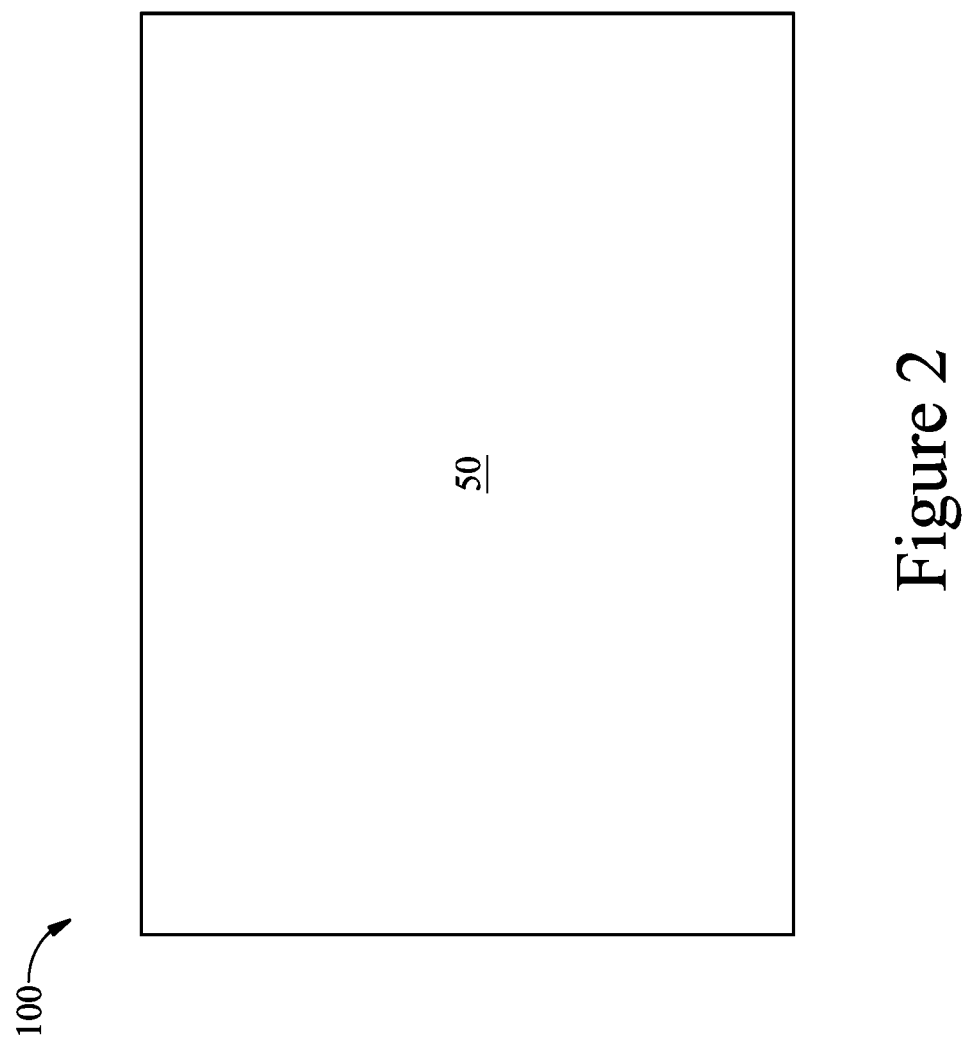

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
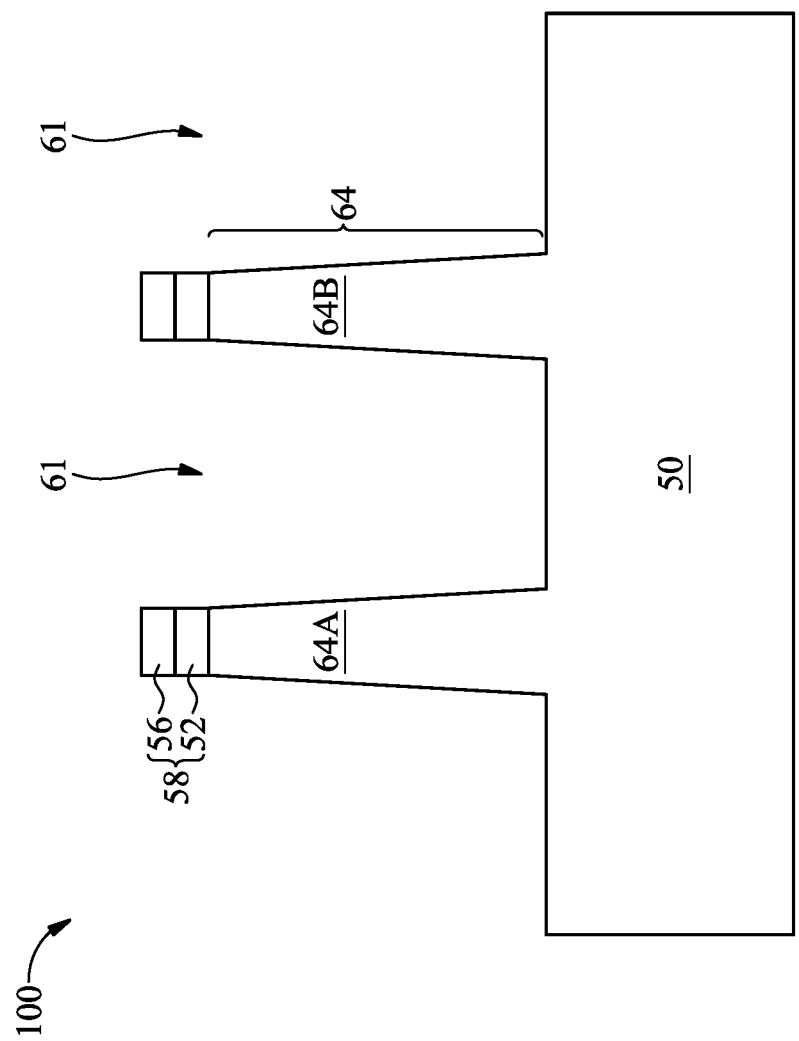

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter. Two fins 64 are illustrated in FIG. 3 as a non-limiting example. Other numbers of fins are also possible and are fully intended to be included within the scope of the present disclosure.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
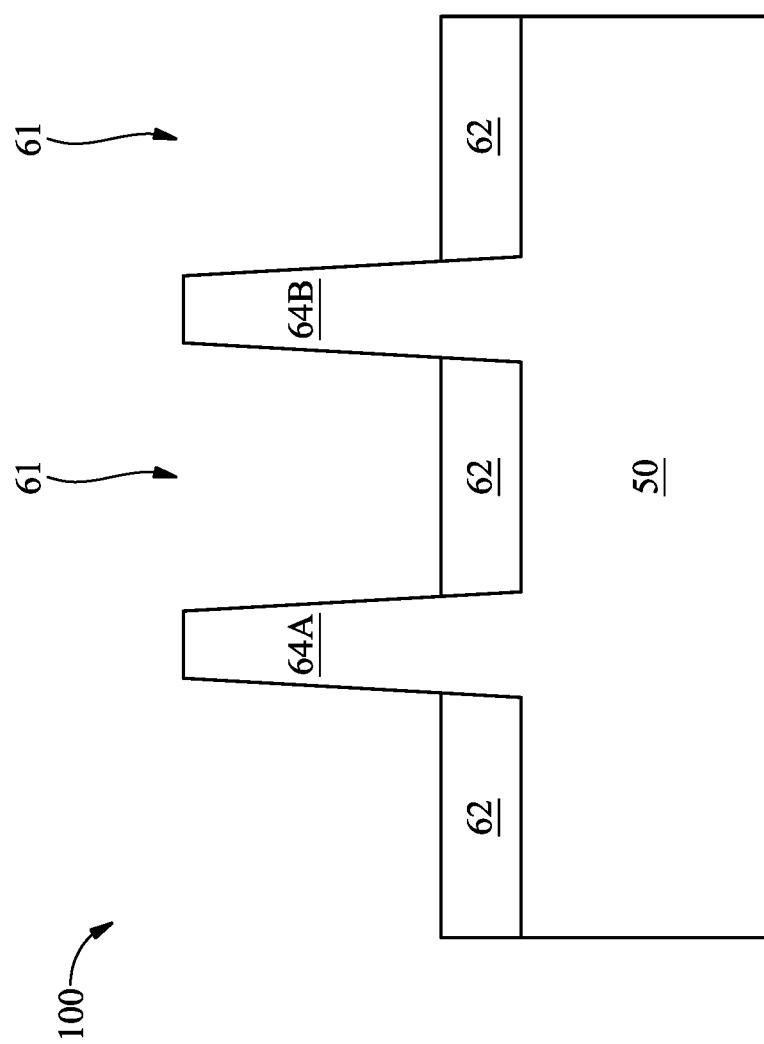

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5A:
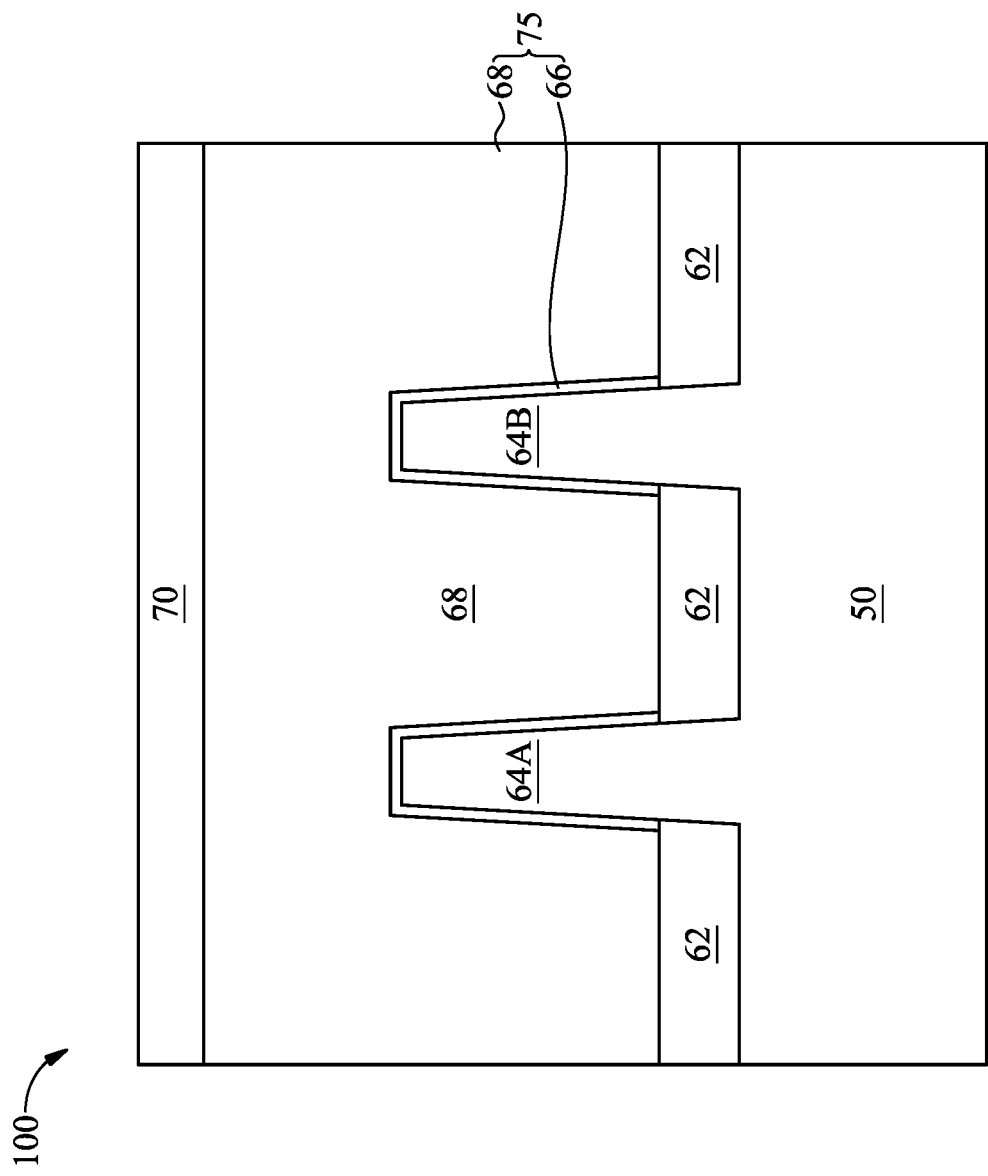

FIGS. 5A and 5B illustrate the formation of dummy gate structure 75 over the semiconductor fins 64. The dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed (e.g., by thermal oxidization of the material of the fins 64) over the fins 64 (e.g., over top surfaces and sidewalls of the fins 64) but not over the STI regions 62 in the example of FIG. 5A. In other embodiments, the gate dielectric 66 may be formed (e.g., deposited) over the fins 64 and over the STI regions 62. For example, the gate dielectric 66 may extends continuously from the fin 64A to the fin 64B. These and other variations are fully intended to be included within the scope of the present disclosure. FIG. 5B shows the corresponding cross-section view along cross-section D-D. Two dummy gate structures 75 are illustrated in FIG. 5B as a non-limiting example. Other numbers of dummy gate structures are also possible and are fully intended to be included within the scope of the present disclosure.

FIGS. 6 and 7A-7F illustrate the formation of hanging dummy gate structures by removing lower portions of the dummy gate structure 75 proximate to the isolation regions 62. In FIG. 6, a protection layer 71 is formed over the mask 70 and over upper portions of the gate electrode 68, while lower portions of the gate electrode 68 are exposed by the protection layer 71. The protection layer 71 is formed of a material different from the material of gate electrode 68, such that in a subsequent etching process, the protection layer 71 prevents or reduces etching of its underlying layers (e.g., upper portion of gate electrode 68). The protection layer 71 may be a dielectric layer, such as a silicon oxide layer or a silicon nitride layer, formed by a suitable deposition process such as PECVD or atomic layer deposition (ALD), although other suitable material, such as a carbon-based coating, may also be used as the protection layer 71. The discussion hereinafter may refer to the protection layer 71 as a dielectric layer 71, with the understanding that any suitable material may be used to form the protection layer 71.

FIG. 6 further illustrates the fin 64 in phantom, since the fin 64 is not in the cross-section of FIG. 6. In the example of FIG. 6, the dielectric layer 71 is formed over upper portions of the gate electrode 68, which upper portions are disposed above an upper surface 64U of the fin 64, while lower portions of the gate electrode 68 disposed below the upper surface 64U are not covered by the dielectric layer 71. Therefore, the deposition process of the dielectric layer 71 may be referred to as a depth-selective deposition process. This depth-selective deposition process may be a result of the small space between adjacent fins 64. As semiconductor manufacturing process continues to advance, features sizes continue to shrink. The distance between two adjacent fins 64 may become so small that the deposition rate of a deposition process becomes low in such small spaces. As a result, when the dielectric layer 71 is being formed, sidewalls of the upper portion of the gate electrode 68, which is above the fin 64, are covered by the deposited dielectric layer 71. In contrast, little or no dielectric layer 71 is formed along sidewalls of the lower portion of the gate electrode 68.

The location of the dielectric layer 71 in FIG. 6 is merely a non-limiting example. For example, the dielectric layer 71 may extends below the upper surface 64U of the fin 64, and may stop at a location between the upper surface 64U of the fin 64 and the upper surface of the isolation region 62. In some embodiments, the sidewalls of the lower portion of the gate electrode 68 are also covered by the dielectric layer 71, but a thickness of the dielectric layer 71 over the lower portions of the gate electrode 68 is smaller than a thickness of the dielectric layer 71 over the upper portions of the gate electrode 68. For example, the thickness of the dielectric layer 71 may decrease continuously as the gate electrode 68 extends toward the isolation regions 62. As a result, in a subsequent etching process, the lower portion of the gate electrode 68 is consumed (e.g., etched) more than the upper portion of the gate electrode 68.

Next, in FIG. 7A, an etching process is performed to remove lower portions of the gate electrode 68. The etching process uses an etchant that is selective to the material (e.g., polysilicon) of the gate electrode 68, in some embodiments. A suitable etching process, such as an anisotropic etching process (e.g., a plasma etching process), may be used to remove the lower portions of the gate electrode 68. In embodiments where plasma etching is used, the lateral etching rate of the plasma etching process is adjusted, e.g., by adjusting a bias power of the plasma etching process, to control the sidewall profile of the gate electrode 68. In other embodiments, a wet etch process is performed to remove the lower portion of the gate electrode 68.

As illustrated in FIG. 7A, after the etching process, portions of the gate electrode 68 proximate to the isolation regions 62 are removed, and there is a gap G between a lower surface of each gate electrode 68 and the isolation regions 62. Note that in the example of FIG. 7A, the upper surface 68U of the gate electrode 68 remain the same before and after the etching process, and the lower surface of the gate electrode 68 is moved upward (e.g., toward the upper surface 68U) by the etching process. Therefore, a height of the gate electrode 68, measured along a direction perpendicular to the upper surface of the substrate 50, is reduced.

In some embodiments, the dielectric layer 71 is removed (e.g., completely removed) by the etching process to remove the lower portions of the gate electrode 68. In other embodiments, after the etching process to remove the lower portions of the gate electrode 68 is performed, the dielectric layer 71 is removed by another suitable etching process, e.g., using an etchant selective to the material of the dielectric layer 71.

FIG. 7B illustrates the perspective view of the FinFET device 100 after the lower portions of the gate electrode 68 are removed. For clarify, not all features of the FinFET device 100 are illustrated in FIG. 7B. For example, the isolation regions 62 and the substrate 50 are not illustrated in FIG. 7B. In addition, only one dummy gate structure is illustrated in FIG. 7B. FIG. 7B further illustrates the cross-sections A-A, B-B, C-C, and D-D illustrated in FIG. 1.

FIG. 7C illustrates the cross-sectional view of the FinFET device 100 along cross-section B-B. As illustrated in FIG. 7C, since the lower portions of the gate electrode 68 are removed, the gate electrode 68 no longer contacts (e.g., physically contact) the isolation regions 62 and hangs over the isolation regions 62. Therefore, the (shortened) dummy gate structure 75 in FIG. 7C is also referred to as a hanging dummy gate structure 75.

Since the gate electrode 68 no longer contacts the isolation regions 62, the hanging dummy gate structure 75 may be prone to collapsing. To prevent the dummy gate structure 75 from collapsing, dimensions of the dummy gate structure 75 and the fins 64 are controlled. In some embodiments, a distance W1 between two adjacent fins 64 is less than about 200 nm (e.g., 0 nm≤W1≤200 nm), and a distance W2 between an edge 68E of the gate electrode 68 and a nearest sidewall of an underlying fin 64 is less than about 100 nm (e.g., 0 nm≤W2≤100 nm). In addition, a depth D1 between a bottom surface of the gate electrode 68 and the upper surface of the fin 64 is between about 10 nm and about 100 nm, and a height H1 between the upper surface of the fin 64 and the upper surface of the mask 70 is less than about 500 nm (e.g., 0 nm≤H1≤500 nm). In some embodiments, a ratio between H1 and D1 is less than about 30 (e.g., H1/D1≤30). The dimensions H1 and D1 are also illustrated in FIG. 7A. By controlling the dimensions (e.g., H1, D1, W1, W2) of the FinFET device 100 to be within the above disclosed ranges, the risk that the hanging dummy gate structure 75 may collapses is reduced or avoided.

FIGS. 7D and 7E illustrate the cross-sectional views of the FinFET device 100 along cross-sections A-A and C-C, respectively. Note that the dummy gate structure 75 is not in the cross-section C-C, thus not illustrated in FIG. 7E. FIG. 7F illustrates a cross-sectional view of the FinFET device 100 along cross-section E-E in FIG. 7C, where the cross-section E-E is along a plane parallel to the upper surface 50U of the substrate 50 and cutting across the channel regions of the fins 64.

FIGS. 8A, 8B, 9A, 9B, 10A, 10B, 11A, 11B, 12A, 12B, 13A, 13B, 14A, 14B, and 15A-15C illustrate additional processing steps to from the FinFET device 100, in accordance with an embodiment. For simplicity, not all features are illustrated in these figures. For example, the substrate 50 is not illustrated in the figures. To facilitate comparison with subsequent figures, (simplified) cross-sectional views of the FinFET device 100 in FIGS. 7A and 7D are shown in FIGS. 8A and 8B, respectively.

Figure 8B:
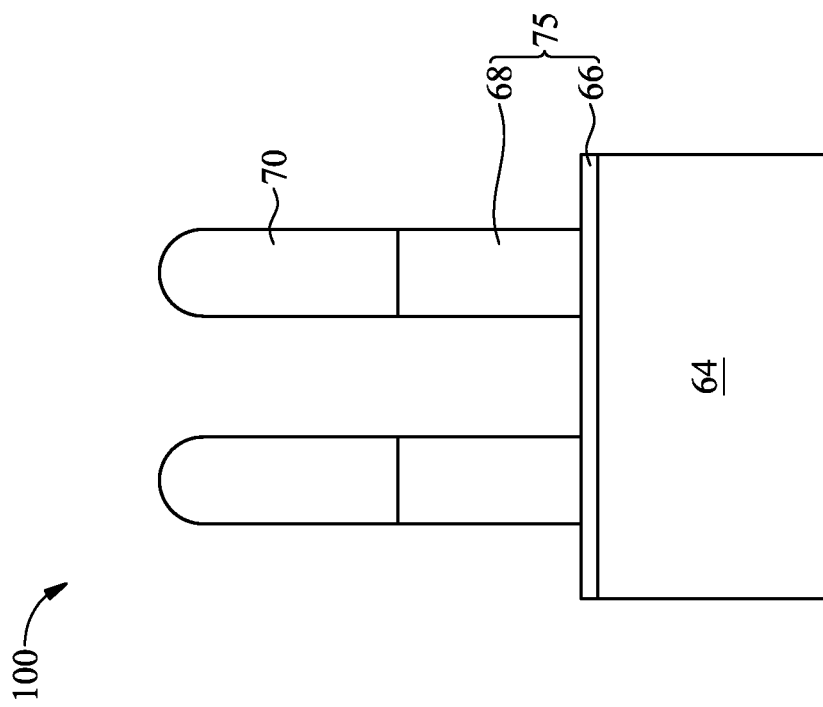
Figure 8A:
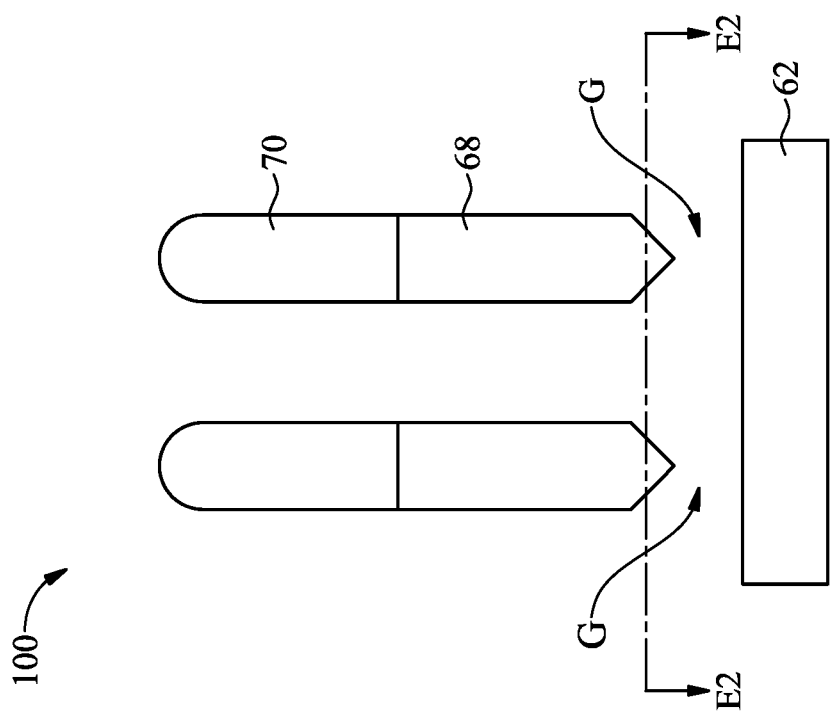
Figure 9B:
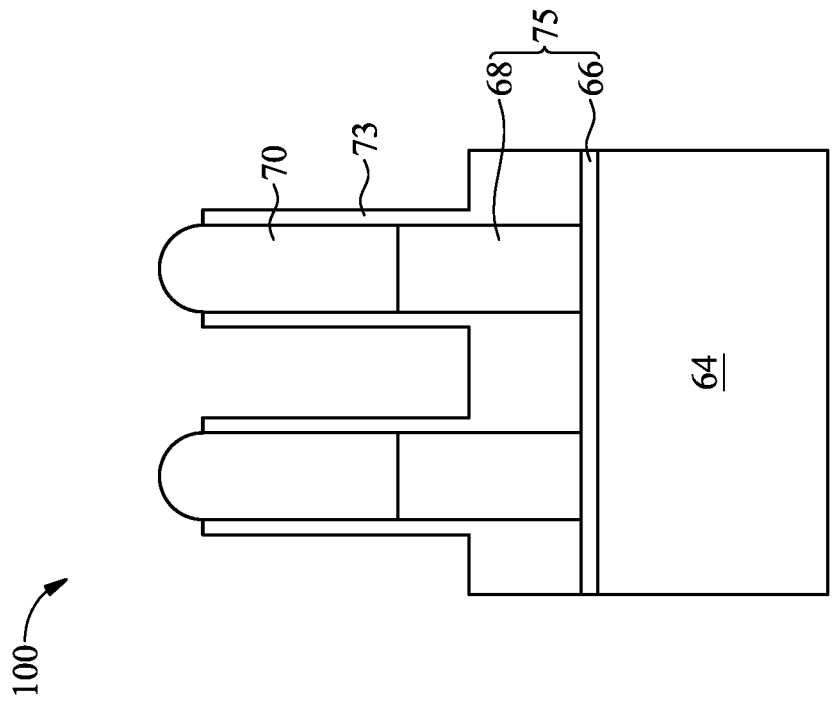
Figure 9A:
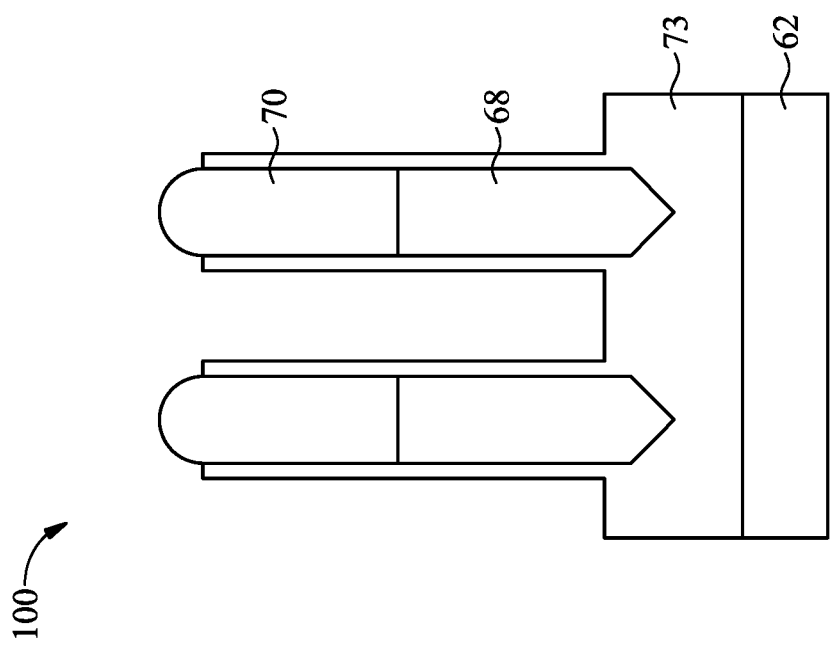

Next, in FIGS. 9A and 9B, a gate fill material 73 is formed over the FinFET device 100 of FIGS. 8A and 8B. The gate fill material 73 fills the gap G between each dummy gate structure 75 and isolation regions 62. The gate fill material 73 may also be formed along sidewalls of the dummy gate structure 75. The gate fill material 73 may be formed in a bottom-up fashion, using a suitable deposition process such as CVD, PECVD, ALD, or plasma-enhanced ALD (PEALD). In a subsequent replacement gate processing, the gate fill material 73 is removed. Therefore, the gate fill material 73 may also be referred to as a dummy gate fill material. In the illustrated embodiment, the gate fill material 73 is formed of a suitable material that provides etching selectivity over (e.g., having different etching rate from) the material of the gate electrode 68, such that the gate electrode 68 and the gate fill material 73 are removed in two different etching processes. Details are discussed below. Example materials for the gate fill material 73 include silicon germanium (SiGe), silicon nitride (SiN), silicon oxynitride (SiON), silicon oxycarbonitride (SiOCN), silicon carbide (SiC), silicon oxycarbides (SiOC), or silicon oxide (SiO), or the like.

Figure 10B:
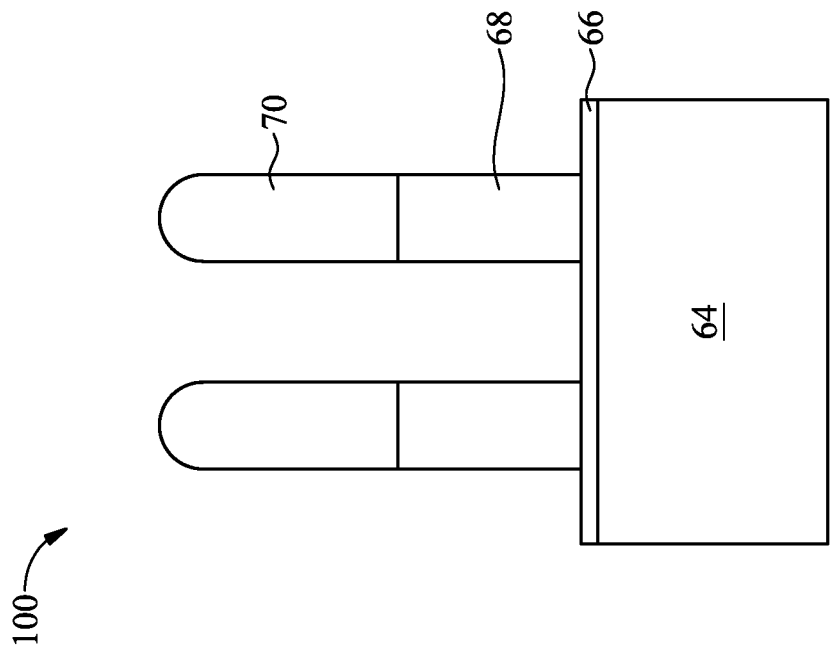
Figure 10A:
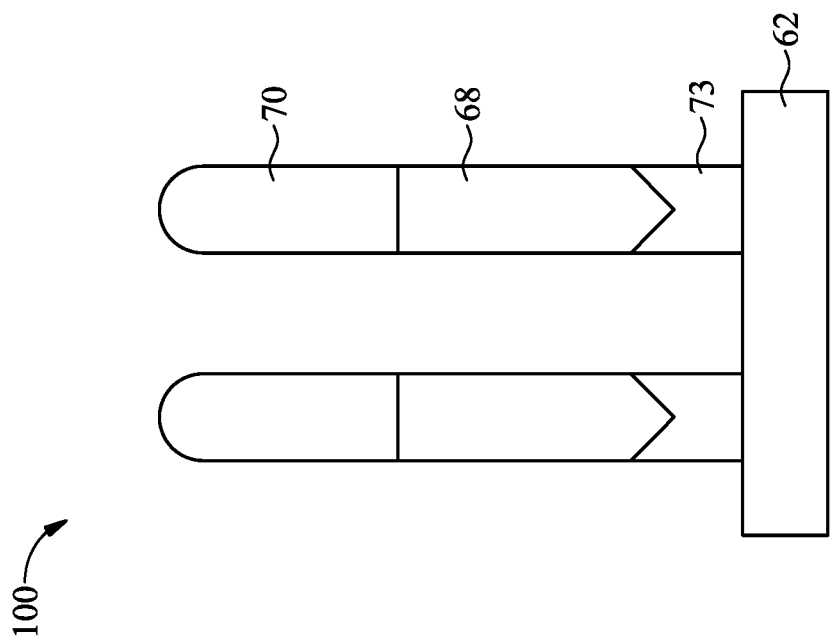

Next, in FIGS. 10A and 10B, an anisotropic etching process, such as a plasma etching process, is performed to remove portions of the gate fill material 73 (e.g., portions disposed outside boundaries of the gate electrode 68). In an embodiment where a plasma etching process is used to remove portions of the gate fill material 73, a bias voltage of the plasma etching process is tuned (e.g., adjusted) to adjust a lateral etching rate of the plasma etching process. In the example of FIGS. 10A and 10B, portions of the gate fill material 73, such as portions disposed along sidewalls of the dummy gate structure 75 and portions disposed between dummy gate structures 75, are removed, and remaining portions of the gate fill material 73 are disposed directly under the dummy gate structures 75 and fill the gaps G (see gaps G in FIG. 8A). The sidewalls of the remaining portions of the gate fill material 73 are aligned with respective sidewalls of the dummy gate structures 75, as illustrated in the example of FIG. 10A. In other embodiments, after the anisotropic etching process, the remaining portions of the gate fill material 73 fill the gaps G and extend along (e.g., cover) the sidewalls of the dummy gate structure 75 (see, e.g., 16A). Note that in the cross-sectional view of FIG. 10B, no gate fill material 73 is left over the gate dielectric 66 after the anisotropic etching process.

Figure 11B:
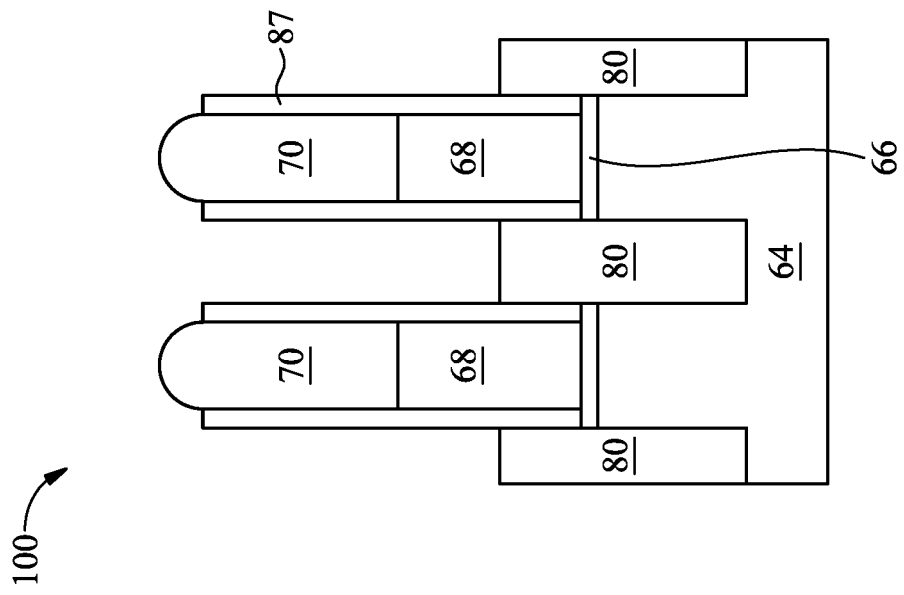
Figure 11A:
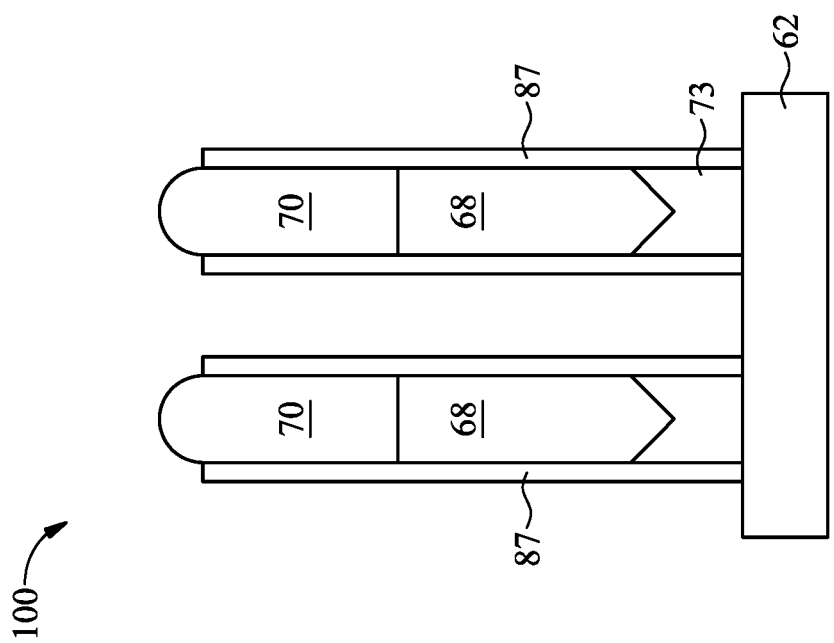

Next, in FIGS. 11A and 11B, gate spacers 87 are formed along sidewalls of the dummy gate structure (e.g., 68 and 70) and along sidewalls of the gate fill material 73. The gate spacers 87 are formed of a nitride, such as silicon nitride, silicon oxynitride, silicon carbonitride, the like, or a combination thereof, and may be formed using, e.g., a thermal oxidation, CVD, or other suitable deposition process, in some embodiments. The gate spacers 87 are formed of a different material from that of the gate fill material 73 and that of the gate electrode 68, in some embodiments.

In an embodiment, the gate spacer 87 is formed by first conformally depositing a gate spacer layer over the FinFET device 100. Next, an anisotropic etch process, such as a dry etch process, is performed to remove a first portion of the gate spacer layer disposed on upper surfaces of the FinFET device 100 (e.g., the upper surface of the mask 70) while keeping a second portion of the gate spacer layer disposed along sidewalls of the dummy gate structures 75 and along sidewalls of the gate fill material 73. The second portion of the gate spacer layer remaining after the anisotropic etch process forms the gate spacer 87. The anisotropic etch process also removes horizontal portions of the gate spacer layer.

The shapes and formation methods of the gate spacer 87 as illustrated in FIGS. 11A and 11B are merely non-limiting examples, and other shapes and formation methods are possible. These and other variations are fully intended to be included within the scope of the present disclosure.

Figure 12B:
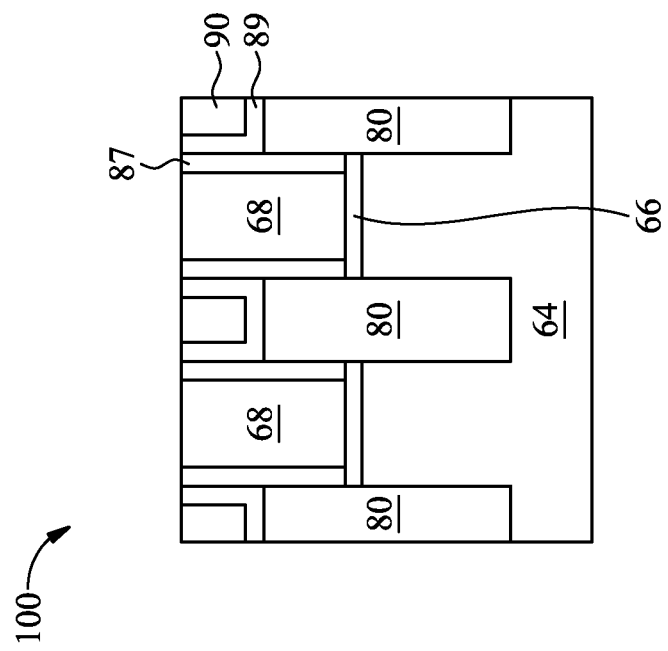
Figure 12A:
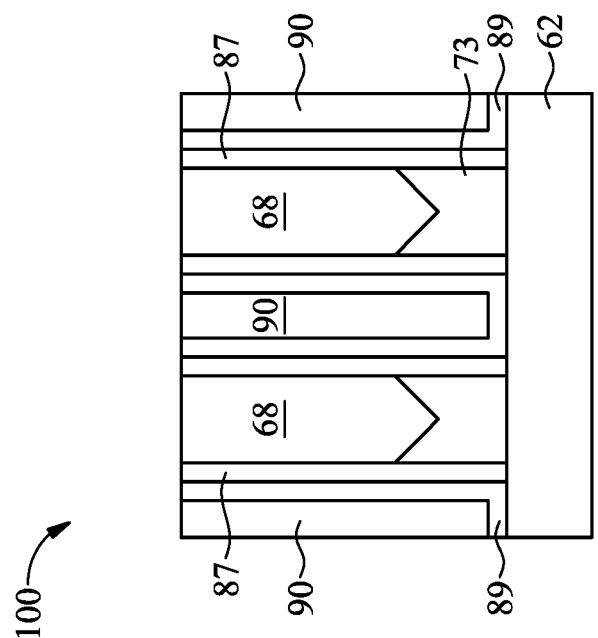

Next, in FIGS. 12A and 12B, source/drain regions 80 are formed in/over the fin 64 on opposing sides of the dummy gate structure 75. The source/drain regions 80 are formed by forming recesses in the fin 64, then epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The gate dielectric 66 disposed outside boundaries (e.g., sidewalls) of the gate spacers 87 is removed by the process to form the recesses for the source/drain regions 80. As illustrated in FIG. 11B, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 for adjacent fins 64 do not merge together and remain separate source/drain regions 80. In some embodiments, the resulting FinFET is an n-type FinFET, and source/drain regions 80 comprise silicon carbide (SiC), silicon phosphorous (SiP), phosphorous-doped silicon carbon (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about $1E19$ cm$^{-3}$ to about $1E21$ cm$^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, a contact etch stop layer (CESL) 89 is formed over the structure illustrated in FIGS. 11A and 11B. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate electrode 68. After the planarization process, the top surface of the first ILD 90 is level with the top surface of the gate electrode 68, in some embodiments.

Next, in FIGS. 13A, 13B, 14A, 14B, 15A, and 15B, an embodiment gate-last process (sometimes referred to as replacement gate process) is performed to replace the gate electrode 68, the gate fill material 73, and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Figure 13B:
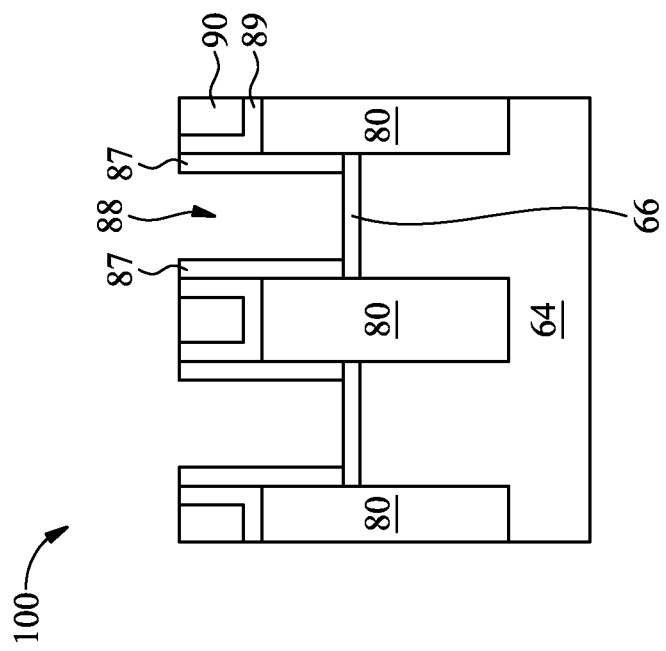
Figure 13A:
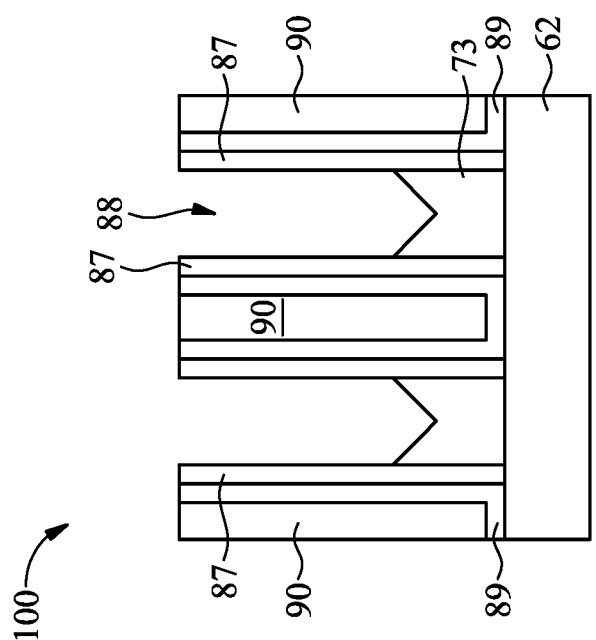

Referring to FIGS. 13A and 13B, the dummy gate electrodes 68 are removed by a first etching process, e.g., using an etchant that is selective to (e.g., having a higher etch rate for) the material of the gate electrode 68. A suitable etching process, such as a wet etch process or a dry etch process, may be performed as the first etching process. After the first etching process, recesses 88 are formed between respective gate spacers 87. In FIG. 13A (cross-sectional view along cross-section D-D), at least portions of the gate fill material 73 remain at the bottom of the recesses 88, and upper inner sidewalls (e.g., upper portions of the sidewalls facing the gate fill material 73) of the gate spacers 87 are exposed. In FIG. 13B (cross-sectional view along cross-section A-A), no gate fill material 73 is left and the dummy gate dielectric 66 is exposed by the recesses 88.

Figure 14B:
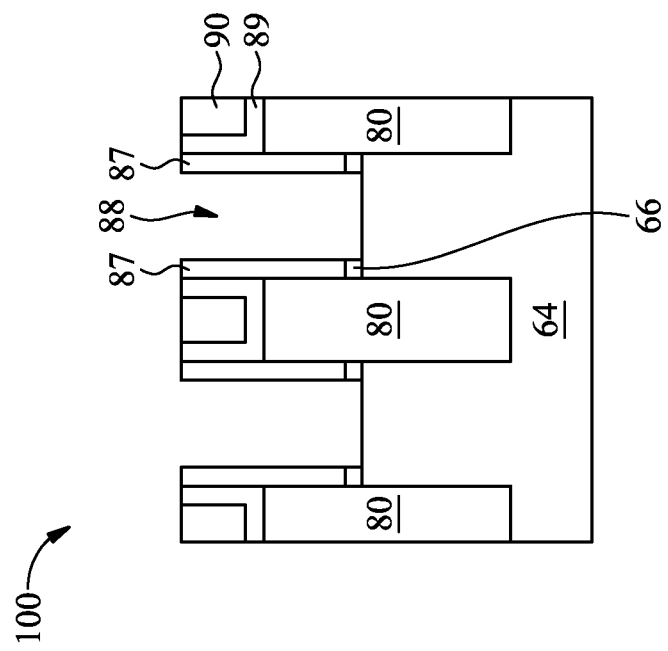
Figure 14A:
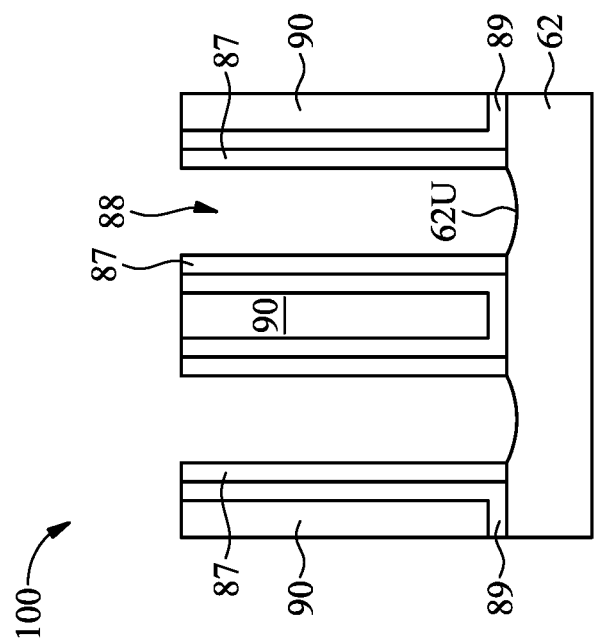

Next, in FIGS. 14A and 14B, a second etching process is performed, after the first etching process is finished, to remove the gate fill material 73, e.g., using an etchant that is selective to the gate fill material 73. A suitable etching process, such as a wet etch process (e.g., using an etching chemical) or a dry etch process, may be performed as the second etching process. In an embodiment, a plasma etch process is performed as the second etching process, where the plasma process uses a gas source comprising a main etch gas and a dilute gas (also referred to as carrier gas). The main etch gas may comprises $Cl_2$, HBr, $CF_4$, $CHF_3$, $CH_2F_2$, $CH_3F$, $C_4F_6$, $BCl_3$, $SF_6$, or $H_2$, and the carrier gas comprises an inert gas, such as Ar, He, Ne, the like, or combinations thereof. In addition, the gas source may optionally include a passivation gas comprising $N_2$, $O_2$, $CO_2$, $SO_2$, CO, or $SiCl_4$. The passivation gas is used to tune the etching selectivity of the second etching process, so as to advantageously reduce or avoid damage to, e.g., the gate spacers 87 and the first ILD 90 during the second etching process.

In some embodiments, a power of the plasma etching process (as the second etching process) is between about 10 W and about 3000 W, and a bias power of the plasma etching process is between about 10 W and about 3000 W. In some embodiments, the bias power is tuned to adjust the lateral etching rate of the plasma etching process. A pressure of the plasma etching process is between about 1 mTorr and about 800 mTorr. A flow rate of the main etching gas, the dilute gas, or the passivation gas is between about 10 standard cubic centimeters per minute (sccm) and about 5000 sccm. In the example of FIGS. 14A and 14B, after the plasma etching process, the gate fill material 73 is removed from the recesses 88, and the plasma etching process also removes portions of the gate dielectric 66 underlying (e.g., directly below) the recesses 88. As illustrated in FIG. 14B, remaining portions of the gate dielectric 66 are disposed directly under the gate spacers 87. In some embodiments, the second etching process also removes upper portions of the isolation regions (e.g., due to over etching), and as a result, isolation regions 62 has a concave upper surface 62U exposed by the recesses 88.

Next, in FIGS. 15A and 15B, a metal gate structure 97 (also referred to as a replacement gate structure) is formed in each of the recesses 88. The metal gate structure 97 has a multi-layered structure (not illustrated in FIGS. 15A and 15B, but illustrated in FIG. 15C), in some embodiments. FIG. 15C illustrates a zoomed-in view of an area 77 in FIG. 15A.

As illustrated in FIG. 15C, the metal gate structure 97 includes a gate dielectric layer 94, a barrier layer 96, a work function layer 98, and a gate electrode 99. In accordance with some embodiments, to form the replacement gate structures 97, the gate dielectric layer 94 is deposited conformally in the recesses 88, such as on the top surfaces and the sidewalls of the fins 64 and on sidewalls of the gate spacers 87, and on a top surface of the first ILD 90 (not shown). In some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as P-type work function layer or N-type work function layer, is formed in the recesses over the barrier layers 96. Exemplary P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses 88. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gate structure 97 of the resulting FinFET device 100. Now that due to the concave upper surface 62U (see FIG. 14A) of the isolation regions, the bottom surface of the metal gate structure 97 is curved (e.g., curved downward into the isolation region 62), as illustrated in FIG. 15A. FIG. 15B illustrates portions of the metal gate structure 97 disposed directly over the fin 64.

One skilled in the art will readily appreciate that additional processing, such as processing to form gate contact plugs, source/drain contact plugs, and interconnect structures, may be performed after the processing step of FIGS. 15A and 15B to complete the fabrication of the FinFET device 100. Details are not discussed here.

Figure 16A:
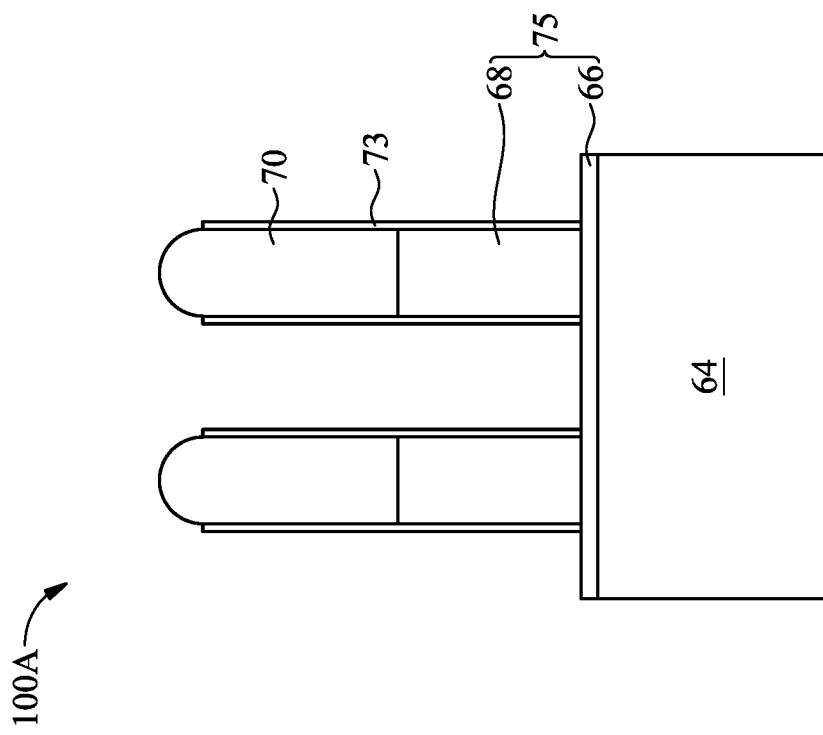
FIGS. 16A, 16B, 17A, 17B, 18A, 18B, 19A, 19B, and 19C illustrate cross-sectional views of a FinFET device 100A at various stages of fabrication, in an embodiment.
Figure 16B:
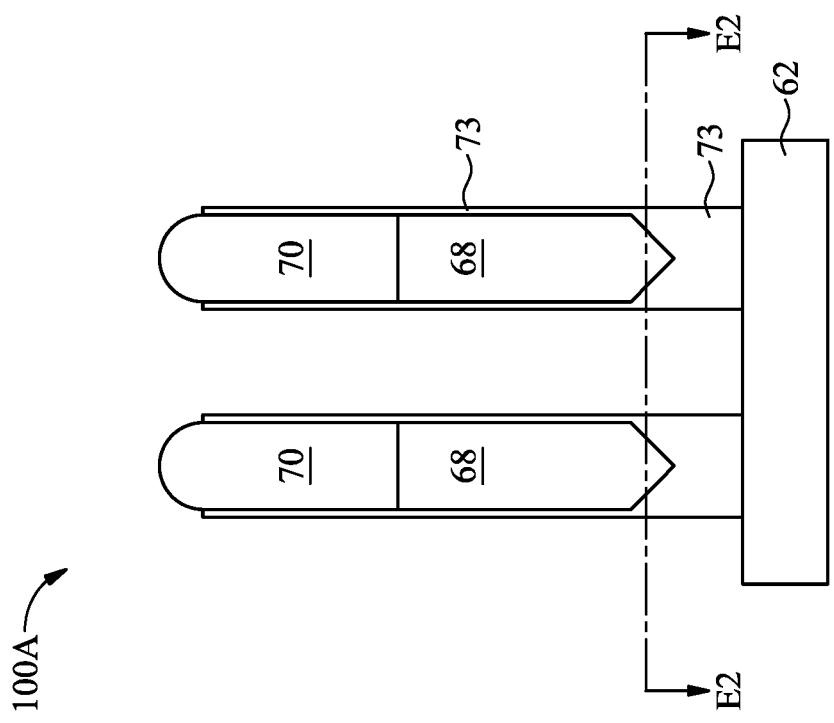

FIGS. 16A, 16B, 17A, 17B, 18A, 18B, 19A, and 19B illustrate cross-sectional views of a FinFET device 100A at various stages of fabrication, in an embodiment. The FinFET device 100A in FIGS. 16A and 16B is similar to the FinFET device 100 in FIGS. 10A and 10B. In other words, the processing of FIGS. 16A and 16B follows the processing step of FIGS. 9A and 9B. In particular, compared with FIGS. 10A and 10B, the lateral etching rate of the anisotropic etching process is adjusted (e.g., reduced), such that sidewalls of the dummy gate structure 75 and sidewalls of the gate fill material 73 are covered by remaining portions of the gate fill material 73 in FIGS. 16A and 16B. In another embodiment, the shape and location of the gate fill material 73 illustrated in FIGS. 16A and 16B may be formed directly after the bottom-up deposition process to form the gate fill material 73, and no additional etching process is performed to shape the gate fill material 73 in order to form the structure illustrated in FIGS. 16A and 16B.

Figure 17B:
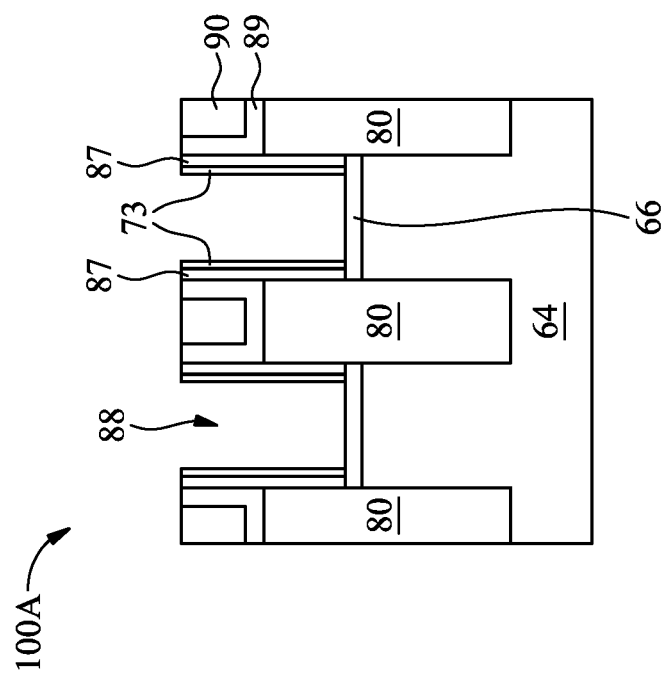
Figure 17A:
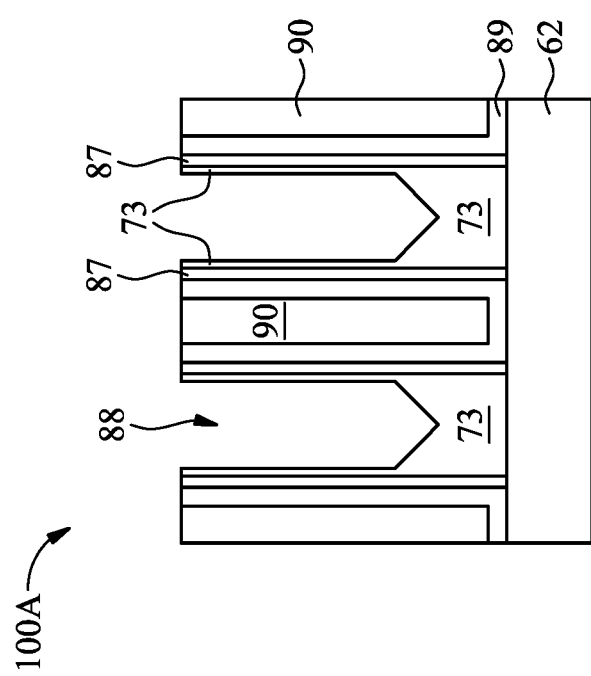

Next, in FIGS. 17A and 17B, the gate spacers 87, the source/drain regions 80, the CESL 89, and the first ILD 90 are formed, using the same or similar processing steps as illustrated in FIGS. 11A, 11B, 12A and 12B. A planarization process, such as CMP, may be performed next to remove the mask 70 and to achieve a coplanar upper surface between the gate electrode 68, the gate spacers 87, the CESL 89, and the first ILD 90.

Next, the first etching process is performed to remove the dummy gate electrode 68, similar to FIGS. 13A and 13B. After the first etching process, the recesses 88 are formed. Note that compared with FIG. 13A, portions of the gate fill material 73 are left covering the entire inner sidewalls (e.g., sidewalls facing the gate fill material 73) of the gate spacers 87. In other words, the gate fill material 73 extends continuously from an upper surface of the gate spacer 87 to the upper surface of the isolation regions 62 in the cross-sectional view of FIG. 17A, and extends continuously from the upper surface of the gate spacer 87 to the upper surface of the gate dielectric 66 in the cross-sectional view of FIG. 17B.

Figure 18B:
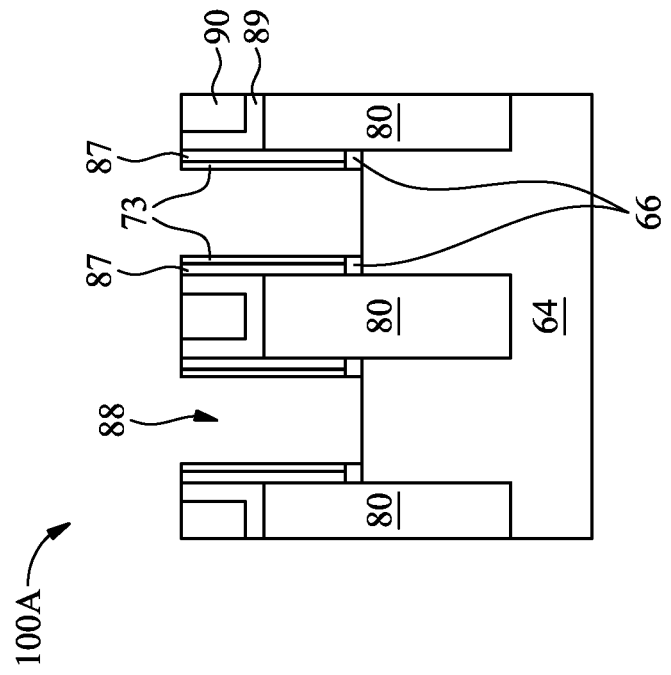
Figure 18A:
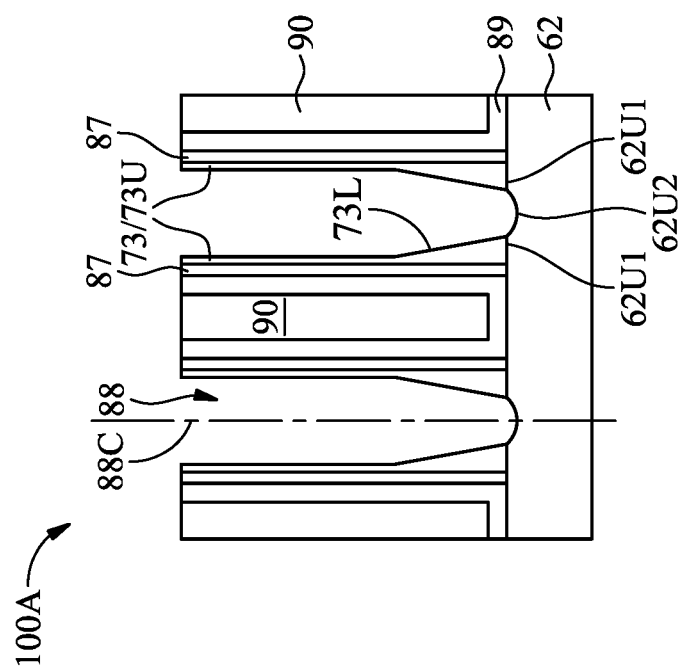

Next, in FIGS. 18A and 18B, the second etching process is performed to remove portions of the gate fill material 73. In some embodiments, the second etching process is a plasma etch process same as or similar to that of FIGS. 14A and 14B. The bias power of the plasma etch process may be adjusted to achieve a target level of anisotropicity (e.g., a target level of lateral etching rate). As illustrated in FIGS. 18A and 18B, after the second etching process, remaining portions of the gate fill material 73 covers the entire inner sidewalls of the gate spacers 87. Lower portions 73L of the remaining gate fill material 73 are thicker than upper portions 73U of the remaining gate fill material 73. The inner sidewalls of the lower portions 73L of the remaining gate fill material 73 (e.g., facing the recesses 88) are sloped or curved toward a center axis 88C of the recess 88. The inner sidewalls of the upper portions 73U may be straight (e.g., perpendicular to the upper surface of the substrate), or may be sloped toward the center axis 88C of the recess 88 as the gate fill material 73 extends toward the isolation regions 62.

In some embodiments, after the second etching process, the gate fill material 73 comprises a first portion directly over the fin (see, e.g., 73 in FIG. 18B), wherein a thickness of the first portion remain a same as the first portion extends from an upper surface of the gate spacers 87 to an upper surface of the fin 64. The gate fill material 73 further comprises a second portion (see, e.g., 73 in FIG. 18A) on a first side of the fin, where the second portion contacts the isolation regions 62, and a thickness of the second portion increases as the second portion extends toward the isolation regions 62.

Note that in FIG. 18A, a center area of the upper surface of the isolation regions 62, which is exposed by the recess 88, has a curved (e.g., concave) upper surface 62U2 due to, e.g., over etching of the second etching process. Upper surface 62U1 of the isolation regions, which is under (e.g., covered by) the lower portion 73L of the gate fill material 73, is substantially flat, since it is protected from the second etching process.

Figure 19A:
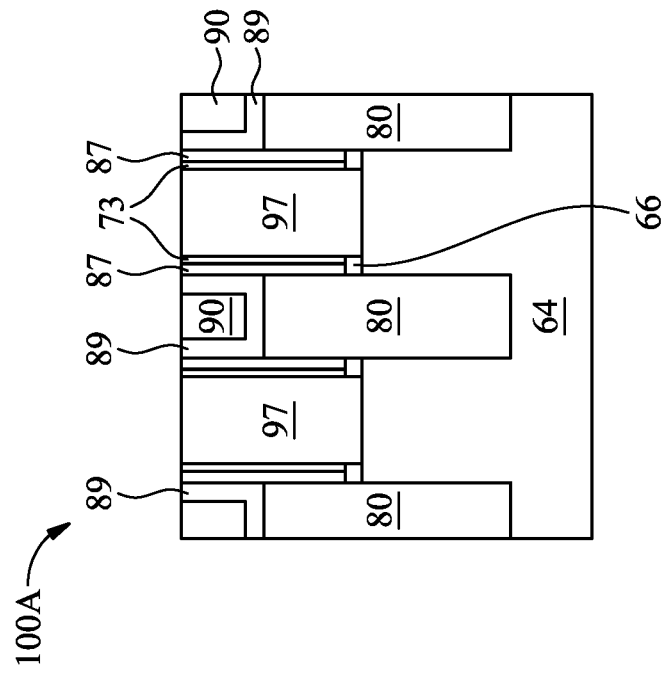
Figure 19B:
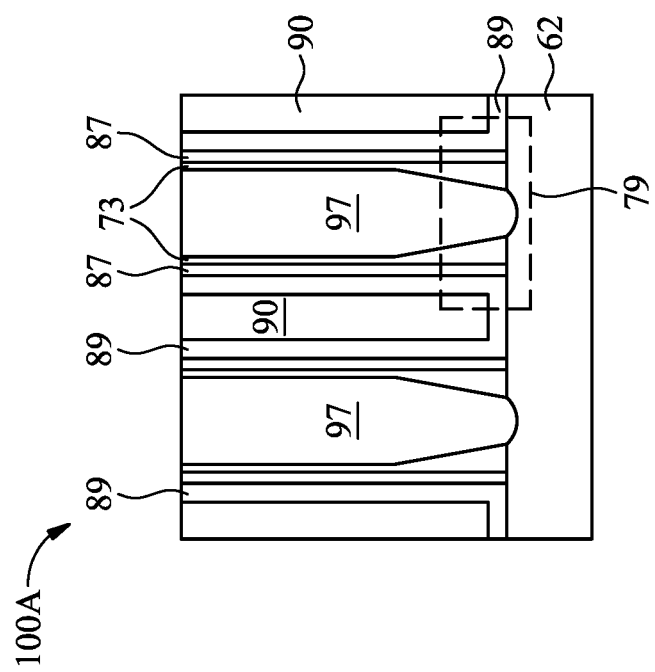

Next, in FIGS. 19A and 19B, the metal gate structure 97 is formed to fill the recesses 88, using the same or similar processing as in FIGS. 15A and 15B. Details are not repeated here.

Figure 19C:
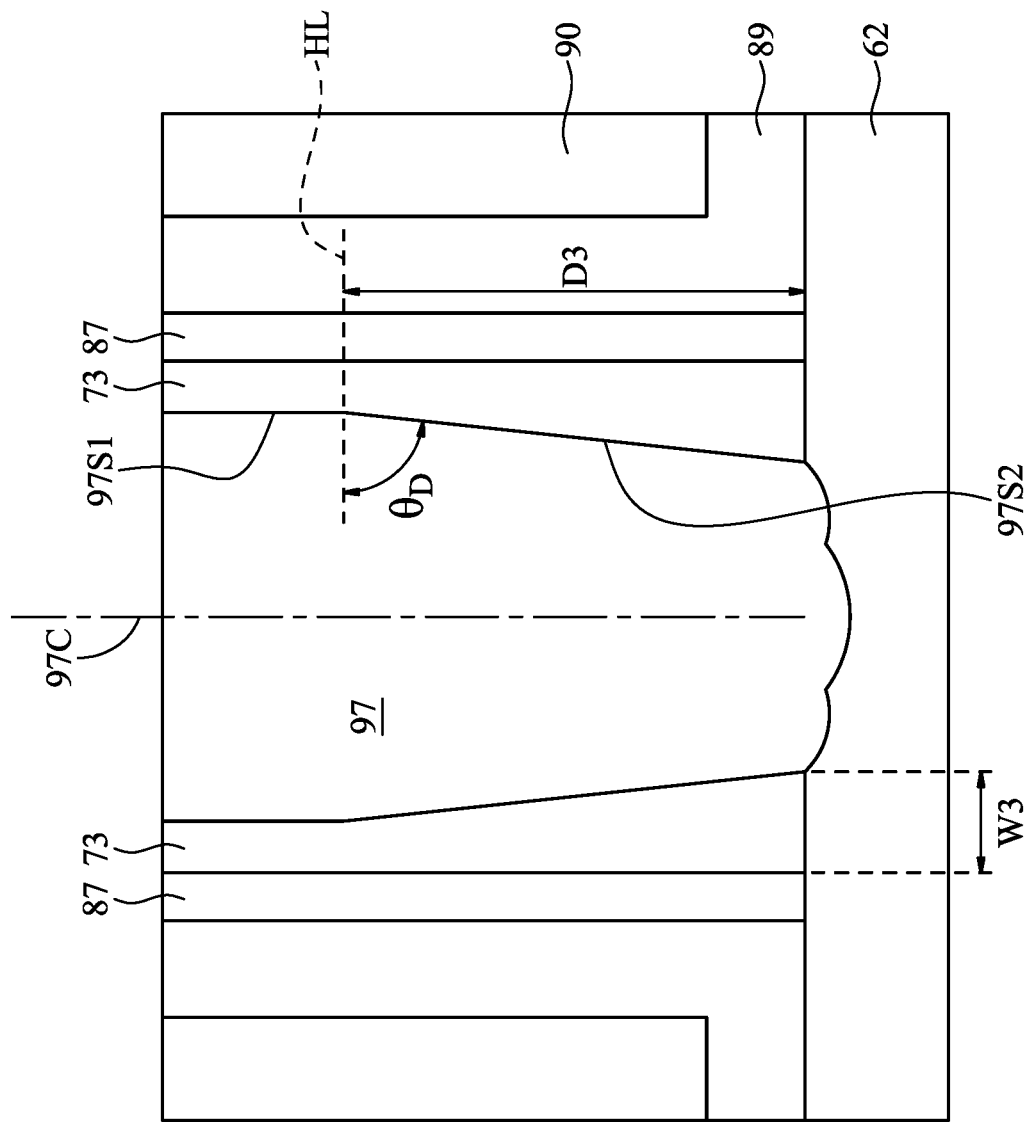

FIG. 19C illustrates a zoomed-in view of an area 79 in FIG. 19A. As illustrated in FIG. 19C, the bottom surface of the metal gate structure 97 is curved and extends into the isolation regions 62. The upper sidewall 97S1 of the metal gate structure 97 may be straight, and the lower sidewall 97S2 of the metal gate structure 97 may be sloped toward a center axis 97C of the metal gate structure 97. An angle $\theta_D$ between the lower sidewall 97S2 and a horizontal line HL in FIG. 19C may be less than about 90 degrees. A height D3 of the lower portion of the metal gate structure 97, measured between the isolation regions 62 and a location where the upper sidewall 97S1 adjoins the lower sidewall 97S2, is between about 0 angstrom and about 1000 angstroms, in an embodiment. A thickness W3 of the lower portion of the gate fill material 73, measured at an interface between the gate fill material 73 and the isolation regions 62, is between about 0 angstroms and about 500 angstroms, in an embodiment.

Figure 20B:
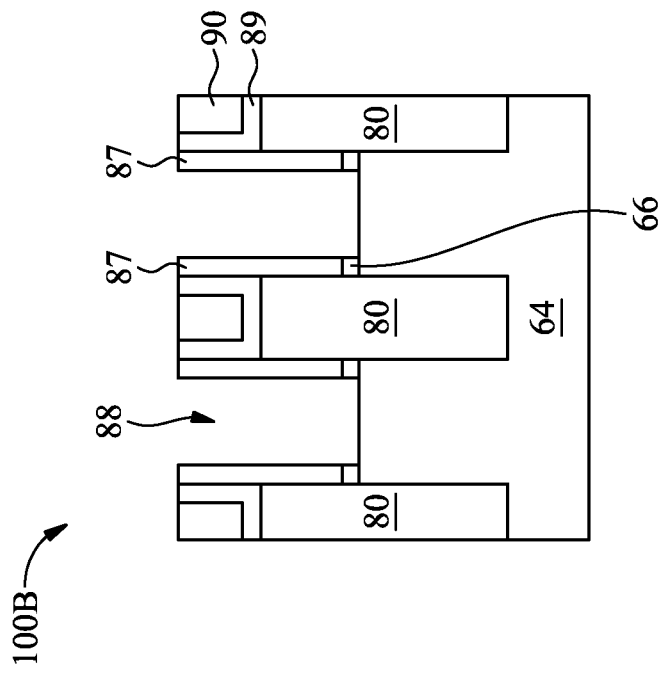
FIGS. 20A, 20B, 21A, and 21B illustrate cross-sectional views of a FinFET device 100B at various stages of fabrication, in an embodiment.
Figure 20A:
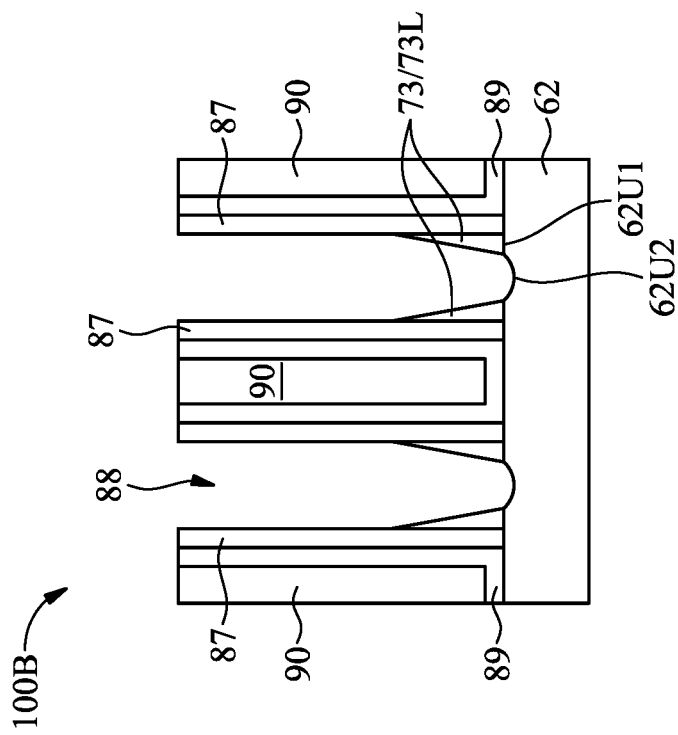

FIGS. 20A, 20B, 21A, and 21B illustrate cross-sectional views of a FinFET device 100B at various stages of fabrication, in an embodiment. The FinFET device 100B in FIGS. 20A and 20B are similar to the FinFET device 100 in FIGS. 13A and 13B, but with the process condition of the second etching process adjusted such that, after the second etching process, only lower portions 73L of the gate fill material 73 are left. In FIG. 20A, an area of the upper surface of the isolation regions 62, which area is exposed by the recess 88, has a curved (e.g., concave) upper surface 62U2 due to, e.g., over etching of the second etching process. Upper surface 62U1 of the isolation regions, which is under (e.g., covered by) the lower portion 73L of the gate fill material 73, is substantially flat, since it is protected from the second etching process.

Figure 21B:
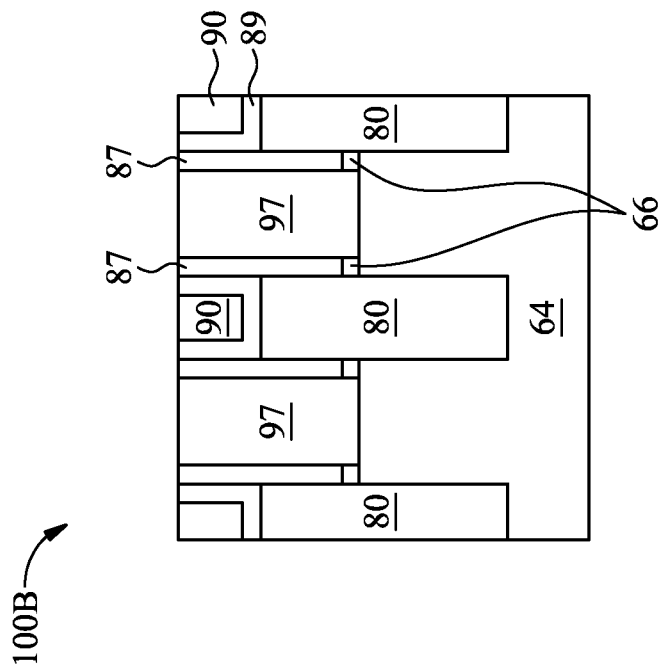
Figure 21A:
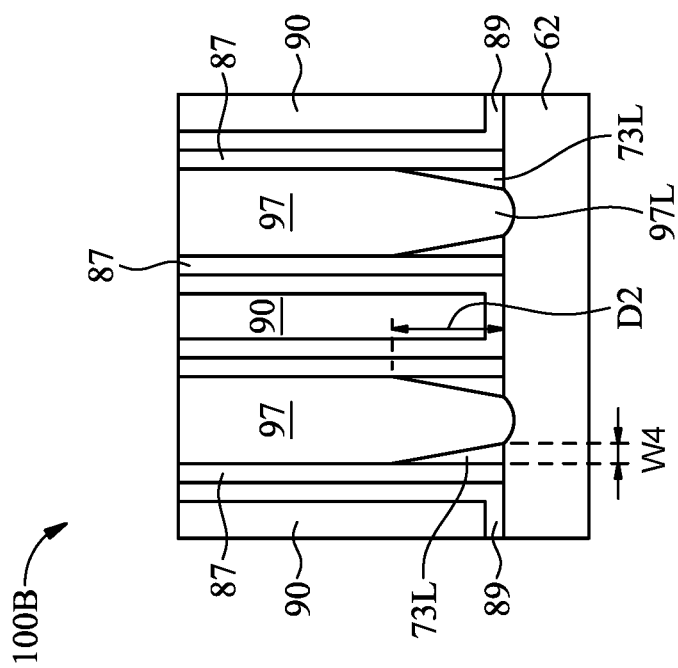

Next, in FIGS. 21A and 21B, the metal gate structures 97 are formed in the recesses 88, using the same or similar processing as FIGS. 15A and 15B. In FIG. 21A, a width W4 of the lower portions 73L of the gate fill material 73 is between about 0 angstrom and about 500 angstroms. A height D2 of the lower portions 73L, which is the same as the height of the lower portions 97L of the metal gate structure 97, is between about 0 angstrom and about 1000 angstroms. Note that upper portions of the metal gate structure 97 has straight sidewalls, and the lower portions of the metal gate structures 97 has sloped or curved sidewalls. In FIG. 21A, a bottom surface of the metal gate structure 97 is curved and extends into the isolation regions 62.

Figure 22C:
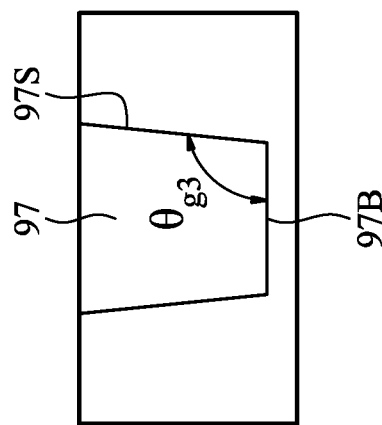
FIGS. 22A-22C illustrate various embodiment cross-sectional views of the gate electrode of a FinFET device, in some embodiments.
Figure 22B:
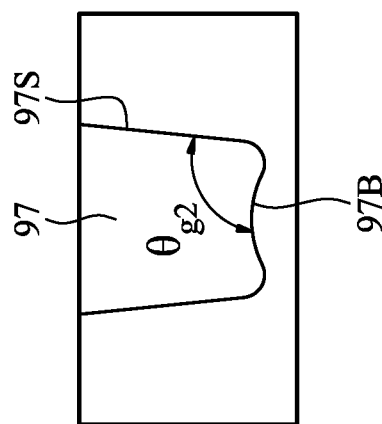
Figure 22A:
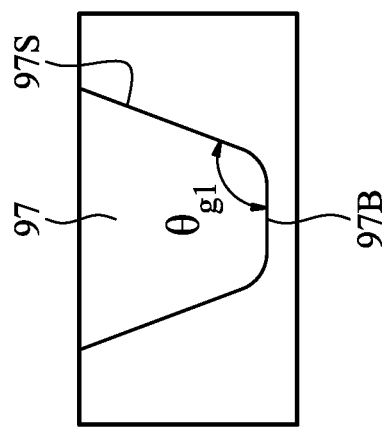

FIGS. 22A-22C illustrate various embodiment cross-sectional views of the bottom portion of the metal gate structure 97 along cross-section D-D. By adjusting the second etching process, (e.g., by controlling the bias voltage to control lateral etching rate, and/or by tuning the selectivity of the second etching process), different shapes and/or sizes for the remaining portions of the gate fill material 73 (see, e.g., 13A, 17A, 20A) can be achieved to control the shape/size of the bottom portion of the metal gate structure 97. For example, in FIG. 22A, the bottom portion of the metal gate structure 97 tapers off and has a curved bottom surface. In FIG. 22B, the metal gate structure 97 has sloped sidewalls, and a bottom surface 97B of the metal gate structure 97 has a slight recess in the middle. In FIG. 22C, the bottom portion of metal gate structure 97 has sloped sidewalls and a flat bottom surface 97B. An angle between the bottom surface 97B and a respective sidewall 97S of the metal gate structure 97, denoted as $\theta_{g1}$, $\theta_{g2}$, and $\theta_{g3}$ respectively in FIGS. 22A, 22B, and 22C, is larger than about 90 degrees.

Figures 23A, 23B:
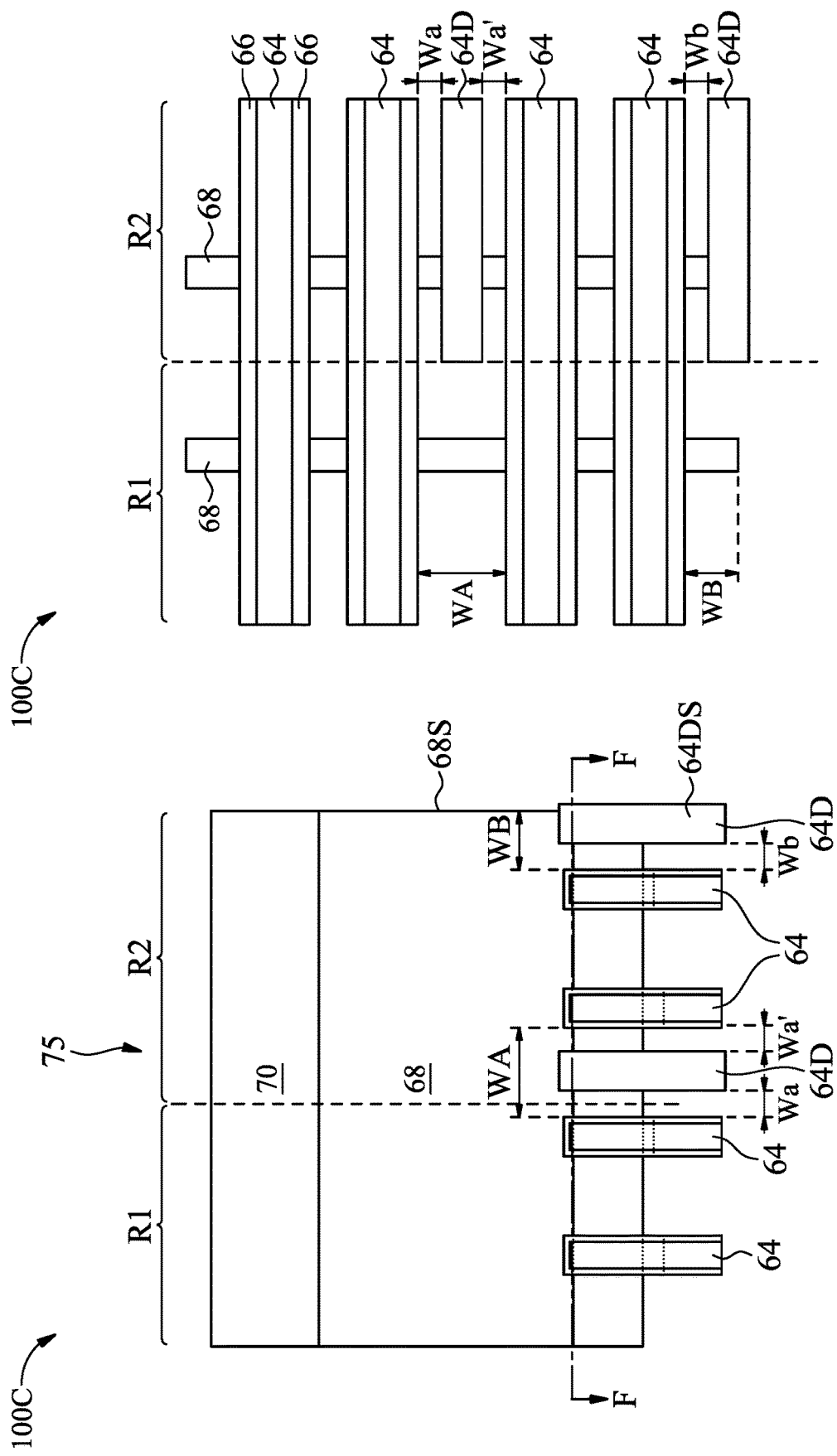
FIGS. 23A, 23B, 24A, and 24B illustrate various views of a FinFET device 100C at various stages of fabrication, in an embodiment.

FIGS. 23A, 23B, 24A, 24B illustrate various views (e.g., cross-sectional view, top view) of a FinFET device 100C at various stages of fabrication, in an embodiment. The FinFET device 100C is similar to the FinFET device 100, 100A, or 100B, but has dummy fins 64D formed to prevent or reduce the risk of collapse for the hanging dummy gate structure 75, or alternatively, allow greater distances between adjacent fins 64 or between a fin 64 and an edge 68S of the dummy gate structure 75. In particular, FIG. 23A is similar to FIG. 7C, and FIG. 23B is similar to FIG. 7F, but with dummy fins 64D formed between some adjacent fins 64, and/or formed at the edge 68S of the dummy gate structure 75. In some embodiments, an outer sidewall 64DS of the dummy fin 64D extends further from the outer fin 64 than the edge 68S.

The dummy fins 64D may be formed of any suitable material, such as a same material (e.g., a semiconductor material) as the fin 64, or a different material (e.g., a dielectric material such as silicon oxide, silicon nitride) from the fin 64. In some embodiments, the dummy fins 64D are formed by a single material. In other embodiments, the dummy fins 64D are formed by two or more materials (e.g., two or more layers of different materials). The dummy fins 64D are formed by a silicon-based material, in some embodiments. In other embodiments, the dummy fins 64D are formed using a dielectric material, such as a metal oxide (e.g., HfO, TaN, the like, or combinations thereof). The dummy fin 64D is electrically isolated, and no source/drain regions are formed on/in the dummy fins 64D, in the illustrated embodiment.

Due to the dummy fins 64D in between, the distance WA between two fins 64 disposed on opposing sides of the dummy fin 64D may be increased beyond the maximum value (e.g., 200 nm) for the distance W1 (see FIG. 7C for designs without the dummy fin 64D). For example, the distance WA between fins 64 may be increased to a value larger than 200 nm, while still maintaining a distance Wa and a distance Wa' that are less than about 200 nm for reduced risk of fin collapsing, where Wa and Wa' are the distances between the dummy fin 64D and the respective fin 64. Similarly, the distance WB between an outer fin 64 and the edge 68S may be increased to a value larger than the maximum value (e.g., about 100 nm) for the distance W2 (see FIG. 7C), while still maintaining a distance Wb that is less than about 100 nm for reduced risk of fin collapsing, where Wb is the distance between the outer fin 64 and the dummy fin 64D. FIG. 23B illustrates a cross-sectional view of the FinFET device 100C across the cross-section F-F, which cuts across the channel region of the fins 64 along a plane parallel to the upper surface of the substrate 50. As illustrated in FIG. 23B, the dummy fins 64D may be shorter than the fins 64, and may be formed in a region R2 with dummy fins, whereas regions R1 has no dummy fins 64D formed. In other embodiments, dummy fins 64D are formed in both regions R1 and R2, and may have a same length as the fins 64.

Figures 24A, 24B:
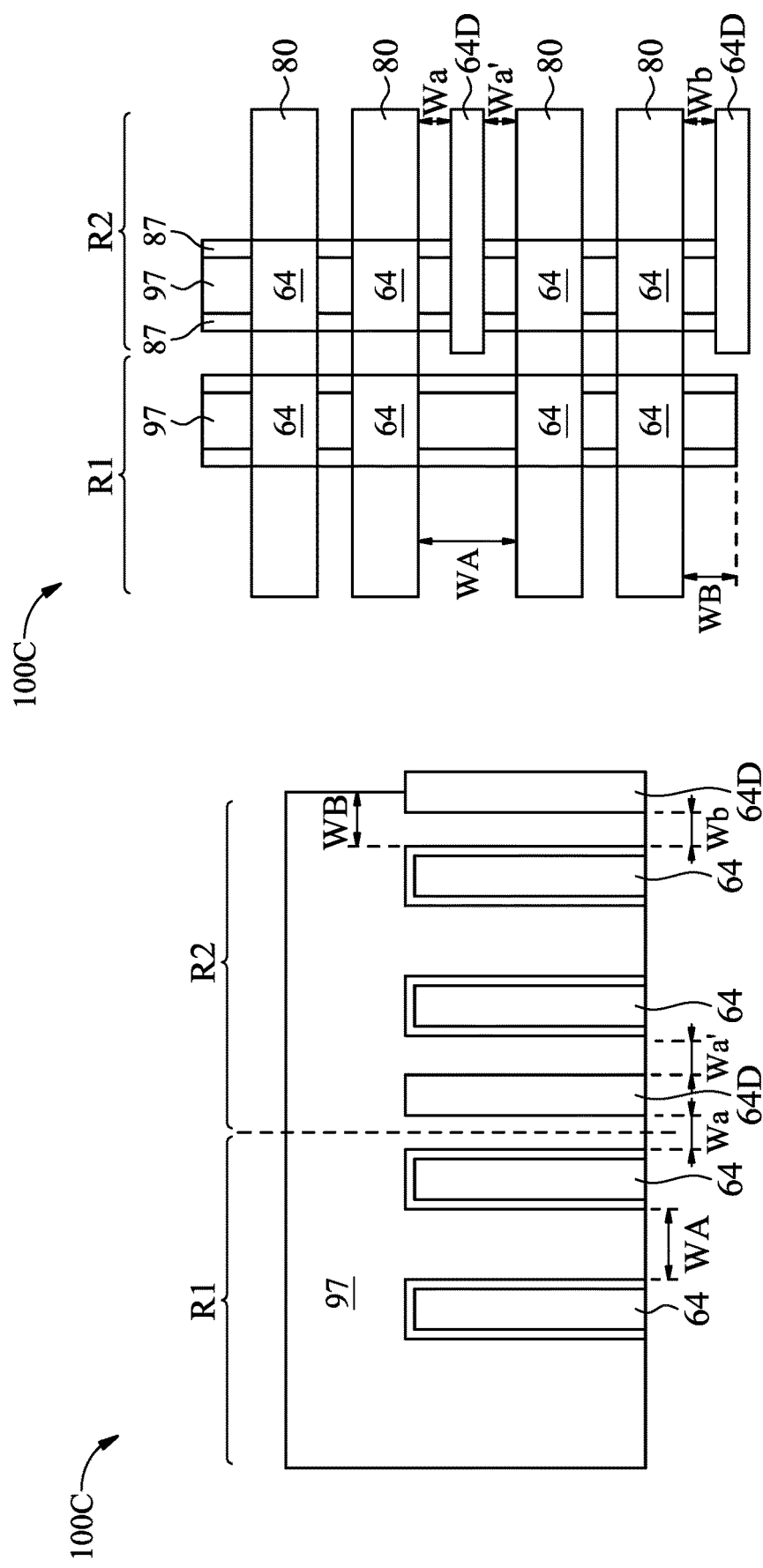

FIGS. 24A and 24B illustrate corresponding cross-sectional views of the FinFET device 100C after the metal gate structures 97 are formed, following the same or similar processing steps discussed above. FIG. 24A shows the metal gate structure 97, and FIG. 24B further illustrates the gate spacers 87, and the source/drain regions 80.

FIGS. 25-30 illustrate cross-sectional views of a FinFET device 200 at various stages of fabrication, in an embodiment. The FinFET device 200 illustrated may be a cross-sectional view of a portion of, e.g., the FinFET device 100A or 100B along a cross-section E2-E2 illustrated in FIG. 16A (also in FIG. 8A). Note that the cross-section E2-E2 is across a lower portion (e.g., a lower portion that tapers off) of the gate electrode 68.

Referring to FIG. 25, the FinFET device 200 is at a same or similar processing step of FIGS. 8A and 8B. Due to the location of the cross-section E2-E2 (e.g., near the end the tapering gate electrode 68), the gate electrode 68 is shown as a thin strip. Note that for simplicity, only portions of the gate electrode 68 between the fins 64 are illustrated in FIGS. 25-30. FIG. 25 also illustrates the corner regions 68C of the gate electrode 68, which extends away from the longitudinal axis 68A of the gate electrode 68, therefore the cross-section of the gate electrode 68 in FIG. 25 has a convex shape. The shape of the corner regions 68C is caused by the etching process (see, e.g., 7A) to form the hanging dummy gate structure 75, because the etching process may have a slower etching rate in the corner regions (e.g., regions of 68C).

Next, in FIG. 26, the gate fill material 73 is formed. The gate fill material 73 may also have corner regions 73C similar to corner regions 68C, due to similar reasons (e.g., slower etching rate at corner regions). Therefore, FIG. 26 may correspond to the processing step of FIGS. 16A and 16B.

Next, in FIG. 27, gate spacers 87 are formed along sidewalls of the gate fill material 73, and source/drain regions 80 are formed over the fins 64. Due to the conformal deposition process and/or the etching process to form the gate spacers 87, the gate spacers 87 have similar corner regions.

Next, in FIG. 28, the gate electrode 68 is removed by the first etching process, and the recesses 88 are formed. Therefore, FIG. 28 may correspond to the processing step of FIGS. 17A and 17B.

Next, in FIG. 29, the second etching process is performed to remove portions of the gate fill material 73, and remaining portions of the gate fill material 73 are disposed along inner sidewalls of the gate spacers 87. Note that due to the slower etching rate of the gate fill material 73 at the corner regions, after the second etching process, the inner sidewalls 73S of the gate fill material 73 at the corner regions bend toward a respective center axis 88A of the recess 88. Therefore, each of the recesses 88 now has a convex shaped cross-section. FIG. 29 may correspond to the processing step of FIGS. 18A and 18B.

Next, in FIG. 30, the metal gate structure 97 is formed to fill the recess 88. Note that due to the recesses 88 having a convex shape, the metal gate structures 97 also have a convex shape. As a result, an angle $\theta_a$ between two adjacent sides in the corner region of the metal gate structure 97, is larger than about 90 degrees and smaller than about 180 degree. Due to the convex shape of the metal gate structure 97, corner regions of the metal gate structures 97 bends inwards toward a center axis 97A of the metal gate structure 97, thus away from the source/drain regions 80. This advantageously increase the distance between the metal gate structures 97 and the source/drain regions 80 and reduces the leakage current (e.g., leakage current between the gate and the source/drain regions) of the FinFET device formed. In contrast, without the currently disclosed formation methods, the metal gate structures 97 may have corner regions that extend outwards toward the source/drain regions 80, which may have increased leakage current.

FIG. 31 illustrates a cross-sectional view of a FinFET device 200A, in an embodiment. The FinFET device 200A is similar to the FinFET device 200 in FIG. 30, but with the gate fill material 73 only in corner regions, which may be due to a higher lateral etching rate of the etching process.

FIG. 32 illustrates a cross-sectional view of a FinFET device 200B, in an embodiment. The FinFET device 200B is similar to the FinFET device 200 in FIG. 30, but with the gate fill material 73 completely removed. Note that due to the over etching to completely remove the gate fill material 73, corner regions of the gate spacers 87 bends inward, which again causes the cross-section of the metal gate structure 97 to have a convex shape.

Figure 33:
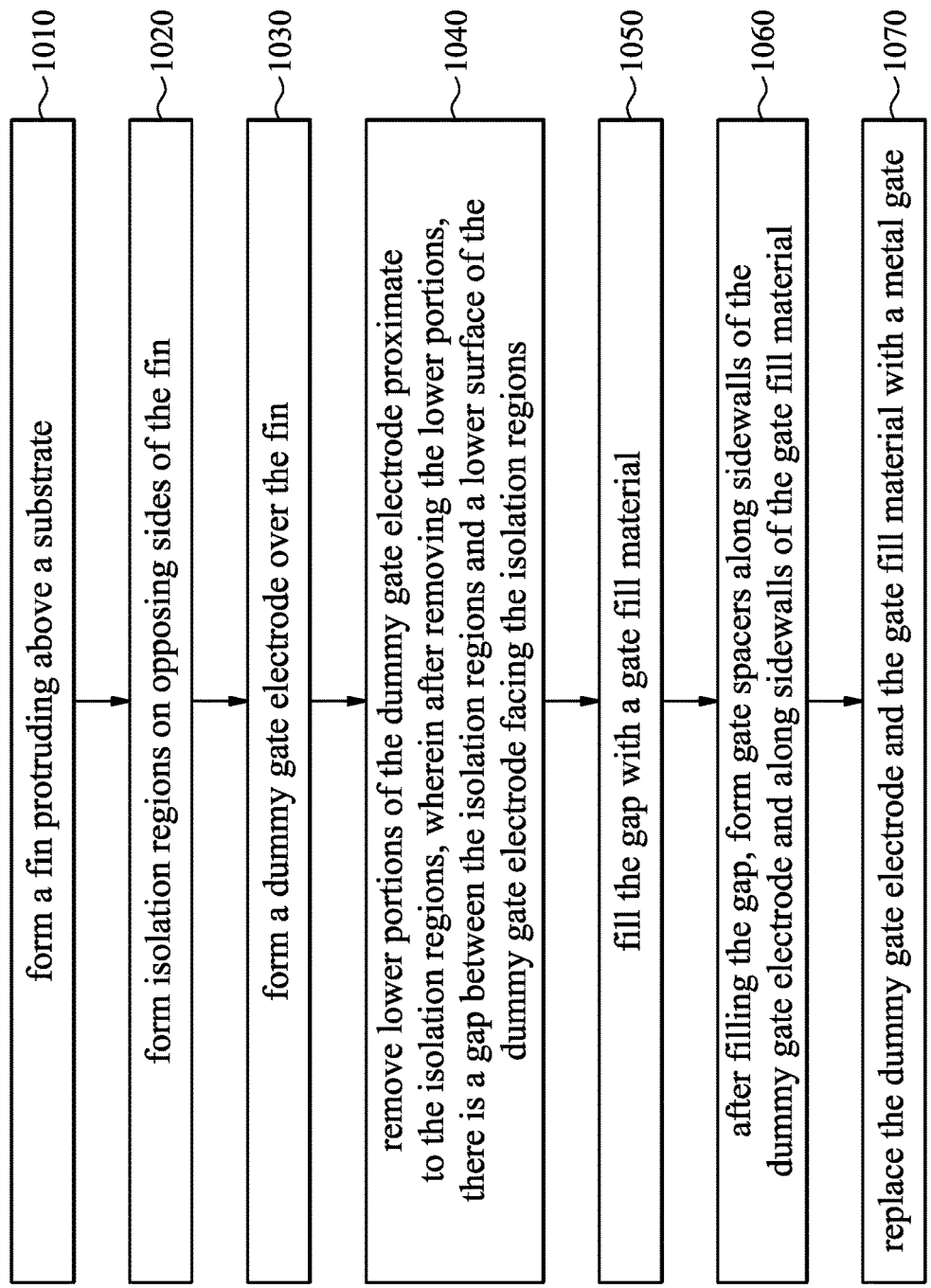
FIG. 33 illustrates a flow chart of method of forming a semiconductor device, in accordance with some embodiments.

FIG. 33 illustrates a flow chart of a method 1000 of forming a semiconductor device, in accordance with some embodiments. It should be understood that the embodiment method shown in FIG. 33 is merely an example of many possible embodiment methods. One of ordinary skill in the art would recognize many variations, alternatives, and modifications. For example, various steps as illustrated in FIG. 33 may be added, removed, replaced, rearranged and repeated.

Referring to FIG. 33, at step 1010, a fin is formed protruding above a substrate. At step 1020, isolation regions are formed on opposing sides of the fin. At step 1030, a dummy gate electrode is formed over the fin. At step 1040, lower portions of the dummy gate electrode proximate to the isolation regions are removed, wherein after removing the lower portions, there is a gap between the isolation regions and a lower surface of the dummy gate electrode facing the isolation regions. At step 1050, the gap is filled with a gate fill material. At step 1060, after filling the gap, gate spacers are formed along sidewalls of the dummy gate electrode and along sidewalls of the gate fill material. At step 1070, the dummy gate electrode and the gate fill material are replaced with a metal gate.

Embodiments may achieve advantages. For example, as semiconductor manufacturing process continues to advance, feature sizes continue to shrink. As the distance between fins becomes smaller and smaller, it is increasingly difficult to deposit material between the fins. Voids, or empty spaces, may be formed in the material deposited between fins, especially near the bottom of the fin. In the process of forming the gate electrode 68, if the gate electrode layer has voids in it, after patterning, the gate electrode 68 may have voids, especially at the bottom of the gate electrode 68. In subsequent processing, gate spacers 87 are formed along sidewalls of the gate electrode 68. If there are voids at the sidewalls of the gate electrode 68, the material of the gate spacer 87 (e.g., silicon nitride) will fill those voids. In the subsequent replacement gate process, the gate electrode 68 is removed and replaced with the gate materials. However, the material (e.g., silicon nitride) of the gate spacers 87 which filled the voids will not be etched away with the gate electrode 68, and will remain in the final metal gate structure 97. This may cause defect or high resistance of the metal gate structure 97. In contrast, the current disclosed methods, by forming hanging dummy gate structure, and by filling the gap G with the dummy gate fill material 73, voids are less likely to form under the gate electrode 68 (due to the bottom-up deposition), and any voids at the sidewalls of the gate electrode 68 are filled with the dummy gate fill material 73, which dummy gate fill material 73 is also removed in the subsequent replacement gate process. Therefore, the problem with voids at the sidewalls of the gate electrode 68, e.g., defect or increased gate resistance of the metal gate structure 97, are avoided or reduced. In addition, as illustrated in FIGS. 25-30, the disclosed embodiment methods increase the distance between the metal gate structure and the source/drain regions 80, thus reducing leakage current of the FinFET device formed.

In an embodiment, a method of forming a semiconductor device includes: forming a fin protruding above a substrate; forming isolation regions on opposing sides of the fin; forming a dummy gate electrode over the fin; removing lower portions of the dummy gate electrode proximate to the isolation regions, where after removing the lower portions, there is a gap between the isolation regions and a lower surface of the dummy gate electrode facing the isolation regions; filling the gap with a gate fill material; after filling the gap, forming gate spacers along sidewalls of the dummy gate electrode and along sidewalls of the gate fill material; and replacing the dummy gate electrode and the gate fill material with a metal gate. In an embodiment, removing lower portions of the dummy gate electrode comprises: forming a dielectric layer over upper portions of the dummy gate electrode, wherein the lower portions of the dummy gate electrode are exposed by the dielectric layer; and performing an etching process, wherein a first etch rate of the dielectric layer is slower than a second etch rate of the dummy gate electrode. In an embodiment, the etching process is a plasma etching process, wherein performing the etching process comprises controlling a lateral etching rate of the plasma etching process by tuning a bias voltage of the plasma etching process. In an embodiment, filling the gap comprises: depositing the gate fill material on the isolation regions, the gate fill material filling the gap and extending along sidewalls of the dummy gate electrode; and after depositing the gate fill material, performing an anisotropic etching process to remove portions of the gate fill material. In an embodiment, after the anisotropic etching process, remaining portions of the gate fill material extend from the lower surface the dummy gate electrode to the isolation regions, and an uppermost surface of the remaining portions of the gate fill material contacts the lower surface of the dummy gate electrode. In an embodiment, after the anisotropic etching process, remaining portions of the gate fill material cover the sidewalls of the dummy gate electrode and extend from an upper surface of the dummy gate electrode to the isolation regions. In an embodiment, replacing the dummy gate electrode and the gate fill material comprises: performing a first etching process to remove the dummy gate electrode, wherein the gate fill material is exposed after the first etching process; performing a second etching process to remove at least portions of the gate fill material, thereby forming an opening between the gate spacers; and forming the metal gate in the opening. In an embodiment, forming the metal gate comprises: lining sidewalls and a bottom of the opening with gate dielectric layer; forming a barrier layer over the gate dielectric layer; forming a work function layer over the barrier layer; and after forming the work function layer, filling the opening with a metal material. In an embodiment, performing the second etching process comprises performing a plasma etching process using a gas source comprising an etching gas, a passivation gas, and a carrier gas, wherein the etching gas comprises $Cl_2$, HBr, $CF_4$, $CHF_3$, $CH_2F_2$, $CH_3F$, $C_4F_6$, $BCl_3$, $SF_6$, or $H_2$, the passivation gas comprises $N_2$, $O_2$, $CO_2$, $SO_2$, CO, or $SiCl_4$, and the carrier gas comprises an inert gas. In an embodiment, after the second etching process, remaining portions of the gate fill material extend from an upper surface of the gate spacers to the isolation regions, wherein a distance, measured between lower sidewalls of the remaining portions of the gate fill material facing the metal gate, decreases as the remaining portions of the gate fill material extend toward the isolation regions. In an embodiment, after the second etching process, remaining portions of the gate fill material cover lower sidewalls of the gate spacers while exposing upper sidewalls of the gate spacers, wherein an upper portion of the metal gate contacts the gate spacers, and a lower portion of the metal gate contacts the remaining portions of the gate fill material.

In an embodiment, a method of forming a semiconductor device includes: forming a dummy gate electrode over a fin, wherein the fin protrudes above a substrate and is interposed between isolation regions; reducing a height of the dummy gate electrode by removing a lower portion of the dummy gate electrode, wherein after reducing the height, there is a gap between the dummy gate electrode and the isolation regions; forming a gate fill material in the gap under the dummy gate electrode; forming gate spacers on opposing sides of the dummy gate electrode and on opposing sides of the gate fill material; after forming the gate spacers, removing the dummy gate electrode and removing at least a portion of the gate fill material to form an opening between the gate spacers; and forming a metal gate in the opening. In an embodiment, a distance, measured between an upper surface of the isolation regions and an upper surface of the dummy gate electrode distal from the isolation regions, remains a same before and after reducing the height of the dummy gate electrode. In an embodiment, the gate fill material is formed to have a same width as the dummy gate electrode such that sidewalls of the dummy gate electrode are aligned with respective sidewalls of the gate fill material. In an embodiment, the gate fill material is formed to fill the gap and to extend along sidewalls of the dummy gate electrode. In an embodiment, after removing at least a portion of the gate fill material, a remaining portion of the gate fill material is interposed between the metal gate and the gate spacers, wherein a lower portion of the metal gate proximate to the isolation regions has a width that decreases as the metal gate extends toward the isolation regions.

In an embodiment, a semiconductor device includes: a fin protruding above a substrate; isolation regions on opposing sides of the fin; a gate structure over the fin; gate spacers along sidewalls of the gate structure; and a gate fill material between the gate structure and the gate spacers, wherein a distance between opposing lower sidewalls of the gate fill material facing the gate structure decreases as the gate fill material extends toward the isolation regions. In an embodiment, the gate fill material is disposed on and contacts the isolation regions, wherein the gate fill material covers lower sidewalls of the gate spacers and exposes upper sidewalls of the gate spacers. In an embodiment, a thickness of the gate fill material increases as the gate fill material extends toward the isolation regions. In an embodiment, the gate fill material separates the gate structure from the gate spacers, wherein the gate fill material comprises: a first portion directly over the fin, wherein a thickness of the first portion remain a same as the first portion extends from an upper surface of the gate spacers to an upper surface of the fin; and a second portion on a first side of the fin and contacting the isolation regions, wherein a thickness of the second portion increases as the second portion extends toward the isolation regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a fin protruding above a substrate;
   isolation regions on opposing sides of the fin;
   a gate structure over the fin, wherein the gate structure comprises a gate dielectric layer and a gate electrode over the gate dielectric layer;
   gate spacers along opposing sidewalls of the gate structure, wherein a first width of a lower portion of the gate structure proximate to the isolation regions, measured between the gate spacers, decreases as the lower portion of the gate structure extends toward the isolation regions; and
   a gate fill material along sidewalls of the lower portion of the gate structure, wherein the gate fill material is between the gate structure and the gate spacers, wherein the gate structure extends into the isolation regions, and is closer to the substrate than a lowest surface of the gate fill material facing the isolation regions.

2. The semiconductor device of claim 1, wherein an upper portion of the gate structure, which is disposed over the lower portion of the gate structure, has a second width that remains the same as the upper portion of the gate structure extends toward the isolation regions.

3. The semiconductor device of claim 1, wherein the gate fill material is disposed on the isolation regions and contacts the isolation regions.

4. The semiconductor device of claim 1, wherein the gate fill material covers sidewalls of the lower portion of the gate structure and exposes sidewalls of an upper portion of the gate structure distal from the substrate.

5. The semiconductor device of claim 4, wherein sidewalls of the gate fill material are aligned with respective sidewalls of the upper portion of the gate structure along same vertical lines.

6. The semiconductor device of claim 1, wherein the gate fill material extends along sidewalls of the gate structure from an upper surface of the gate structure distal from the substrate to a lower surface of the gate structure facing the substrate.

7. The semiconductor device of claim 6, wherein an upper portion of the gate fill material distal from the isolation regions has a uniform thickness, and a lower portion of the gate fill material proximate to the isolation regions has a thickness that increases as the gate fill material extends toward the isolation regions.

8. The semiconductor device of claim 1, wherein the lowest surface of the gate fill material is a flat surface, wherein a lower surface of the gate structure facing the isolation regions is a curved surface.

9. The semiconductor device of claim 1, wherein the lowest surface of the gate fill material contacts the isolation regions.

10. The semiconductor device of claim 1, further comprising a dummy fin adjacent to the fin and extending parallel to the fin, wherein the gate structure is over the dummy fin and the fin.

11. The semiconductor device of claim 10, wherein the dummy fin is shorter than the fin.

12. A semiconductor device comprising:
    a substrate;

a fin protruding above the substrate;

isolation regions on opposing sides of the fin;

a gate structure over the fin, wherein the gate structure comprises a gate dielectric layer and a gate electrode over the gate dielectric layer;

gate spacers along opposing sidewalls of the gate structure; and a gate fill material around the gate structure, wherein the gate fill material is disposed laterally between the gate spacers and the gate structure, and is disposed vertically between the gate structure and the isolation regions.

13. The semiconductor device of claim 12, wherein a lower portion of the gate structure contacts the isolation regions, wherein the lower portion of the gate structure tapers off as the lower portion of the gate structure extends toward the isolation regions.

14. The semiconductor device of claim 13, wherein the gate fill material contacts and extends along sidewalls of the lower portion of the gate structure.

15. The semiconductor device of claim 14, wherein sidewalls of an upper portion of the gate structure are free of the gate fill material.

16. The semiconductor device of claim 14, wherein the gate fill material further contacts and extends along sidewalls of an upper portion of the gate structure, wherein the gate spacers are separated from the gate structure by the gate fill material.

17. A semiconductor device comprising:

a fin that protrudes above a substrate;

isolation regions on opposite sides of the fin;

a gate structure over the fin, wherein the gate structure comprises a gate dielectric layer and a gate electrode over the gate dielectric layer;

gate spacers along opposite sidewalls of the gate structure, wherein a lower portion of the gate structure extends into the isolation regions, wherein the lower portion of the gate structure tapers off as the gate structure extend toward the isolation regions; and a gate fill material along sidewalls of the lower portion of the gate structure, wherein the gate fill material is between the gate spacers and the gate structure, wherein a width of the gate fill material along the sidewalls of the lower portion of the gate structure increases as the gate fill material extends toward the isolation regions.

18. The semiconductor device of claim 17, wherein an upper portion of the gate structure distal from the substrate has a uniform width measured between the gate spacers.

19. The semiconductor device of claim 18, wherein the gate fill material extends along sidewalls of the upper portion of the gate structure.

20. The semiconductor device of claim 18, wherein sidewalls of the upper portion of the gate structure contact the gate spacers.

* * * * *